United States Patent [19]

Hyatt

[11] Patent Number: 4,825,364

[45] Date of Patent: Apr. 25, 1989

[54] MONOLITHIC DATA PROCESSOR WITH MEMORY REFRESH

[76] Inventor: Gilbert P. Hyatt, 7841 Jennifer Cir., La Palma, Calif. 90703

[21] Appl. No.: 402,520

[22] Filed: Oct. 1, 1973

Related U.S. Application Data

[63] Continuation of Ser. No. 101,881, Dec. 28, 1970.

[51] Int. Cl.[4] .......................... G06F 1/00; G06F 13/00
[52] U.S. Cl. ...................................... 364/200; 365/222
[58] Field of Search ...................................... 340/172.5; 364/200 MS File, 900 MS File; 365/222, 154, 176, 181

[56] References Cited

U.S. PATENT DOCUMENTS

| | | | |
|---|---|---|---|
| 3,012,724 | 12/1961 | Williams et al. | 235/157 |
| 3,088,661 | 5/1963 | Brigham et al. | |
| 3,142,820 | 7/1964 | Daniels . | |
| 3,187,321 | 6/1965 | Kameny . | |
| 3,209,074 | 9/1965 | French . | |
| 3,248,708 | 4/1966 | Haynes | 340/172.5 |
| 3,297,107 | 1/1967 | Shipp . | |
| 3,315,235 | 5/1967 | Carnevale et al. | |
| 3,332,071 | 7/1967 | Goldman et al. | |
| 3,346,853 | 10/1967 | Koster . | |
| 3,356,836 | 12/1967 | Stenby . | |
| 3,389,404 | 6/1968 | Koster . | |
| 3,398,241 | 8/1968 | Lee . | |
| 3,406,379 | 10/1963 | Palevksy et al. | |
| 3,462,742 | 8/1969 | Miller | 364/200 |
| 3,487,369 | 12/1969 | King et al. | |
| 3,509,329 | 4/1970 | Wang et al. | |
| 3,515,792 | 6/1970 | Deutsch . | |
| 3,560,933 | 2/1971 | Schwartz | 340/172.5 |
| 3,566,365 | 2/1971 | Rawson et al. | |
| 3,566,366 | 2/1971 | Quinn et al. | 340/172.5 |
| 3,566,370 | 2/1971 | Worthington et al. | |
| 3,588,353 | 6/1971 | Martin . | |
| 3,593,306 | 7/1971 | Toy | 340/172.5 |
| 3,596,256 | 7/1971 | Alpert et al. | |
| 3,631,408 | 12/1971 | Kubo | 365/222 |
| 3,634,883 | 1/1972 | Kreidermacher | 340/172.5 |
| 3,641,496 | 2/1972 | Slavin . | |
| 3,646,522 | 2/1972 | Furman et al. | 340/172.5 |
| 3,648,255 | 3/1972 | Beausoleil | 364/200 |
| 3,654,708 | 4/1972 | Brudner . | |
| 3,657,705 | 4/1972 | Mekota et al. | 340/172.5 |
| 3,679,875 | 7/1972 | Rawson et al. | |
| 3,681,756 | 8/1972 | Burkhard et al. | |
| 3,685,027 | 8/1972 | Allen | 365/222 |
| 3,686,637 | 8/1972 | Zachar et al. | |
| 3,688,271 | 8/1972 | Rouse . | |
| 3,702,988 | 11/1972 | Haney | 364/200 |
| 3,727,190 | 4/1973 | Vogelman et al. | |
| 3,737,863 | 6/1973 | Rowland et al. | |
| 3,740,725 | 6/1973 | Fletcher . | |
| 3,744,030 | 7/1973 | Kuljian . | |
| 3,747,069 | 7/1973 | Hershberg . | |
| 3,775,756 | 11/1973 | Balser . | |
| 3,778,774 | 12/1973 | Philipps et al. | |
| 3,810,106 | 5/1974 | Nadler et al. | |
| 3,878,514 | 4/1975 | Faber . | |

OTHER PUBLICATIONS

"System Utilization of Large-Scale Integrations", Levy, Linhardt, Miller, Sidnam, *IEEE Transactions on Electronic Computers,* vol. EC-16, No. 5, Oct. 1967, pp. 562-566.

"System Architecture for Large-Scale Integration", Beelitz, Levy, Linhardt, Miller, *AFIPS Conference Proceedings,* vol. 31, Nov. 14-16, 1967, pp. 185-200.

"Microprogrammable Digital Computer", by Micro Systems, Inc., *Computer Design,* vol. 8, May 1969, p. 69.

"Numerical Control of Vertical Machining Center", Microprogramming Handbook by Microdata, pp. 65, 66.

"Microprogram Function Summary", Microprogramming Handbook, Supra, p. 10.

(List continued on next page.)

*Primary Examiner*—Raulfe B. Zache
*Attorney, Agent, or Firm*—Gilbert P. Hyatt

[57] ABSTRACT

An improved data processor architecture is provided having integrated circuit (IC) memories. Provision is made for dynamic memories with a memory refresh arrangement. Memory refresh is provided in response to instruction execution, synchronized with computer control signals to minimize contension or conflicts with computer operations and to share control circuitry.

33 Claims, 2 Drawing Sheets

OTHER PUBLICATIONS

"Data Communications Application, Special Purpose Concentrator", Microprogramming Handbook, Supra, p. 64.

Bauer et al; DODDAC-An Integrated System for Data Processing, Interrogation, and Display.

Booth and Booth; Automatic Digital Calculators; 1953.

Boysel; Memory on a Chip: A Step Toward Large Scale Integration; Electronics; Feb. 1967.

Buchholz; Computer Controlled Audio Output; IBM Bulletin; Oct. 1960.

Chapman; Prospectives in Voice Response from Computers; Proceedings of the International Conference on Comm; 1970.

Davis; Computer Data Displays; Prentice Hall; 1969.

Flanagan et al; Synthetic Voices for Computers; IEEE Spectrum; Oct. 1970.

Hopkins; Electronic Navigator Charts Man's Path to the Moon; Electronics; Jan. 1967.

Hovik; Microprogramming; Electronic Prod. Mag.; Apr. 1971.

Hudson; The Applications and Implications of Large Scale Integration; Computer Design; Jun. 1968.

Koster; A Stored Program Display Console: Bunker Ramo Model 90; Sixth National Symposium on Information Display; Sep. 1965.

Mathews; The Digital Computer as a Musical Instrument; Science; Nov. 1963.

Rice; LSI and Computer System Architecture; Computer Design; Dec. 1970.

Weitzman; Voice Recognition and Response Systems; Datamation; Dec. 1969.

Hewlett Packard; Automatic Calculator Plotting with the HP System 9100.

Hewlett Packard Calculator Model 9100A Service Manual.

IBM 7094 Data Processing System; Form No. A22-6703; Oct. 21, 1966.

IBM Systems Reference Library; IBM 7094, Principles of Operation; File No. 7094-01, GA-22-6703-4 (complete document).

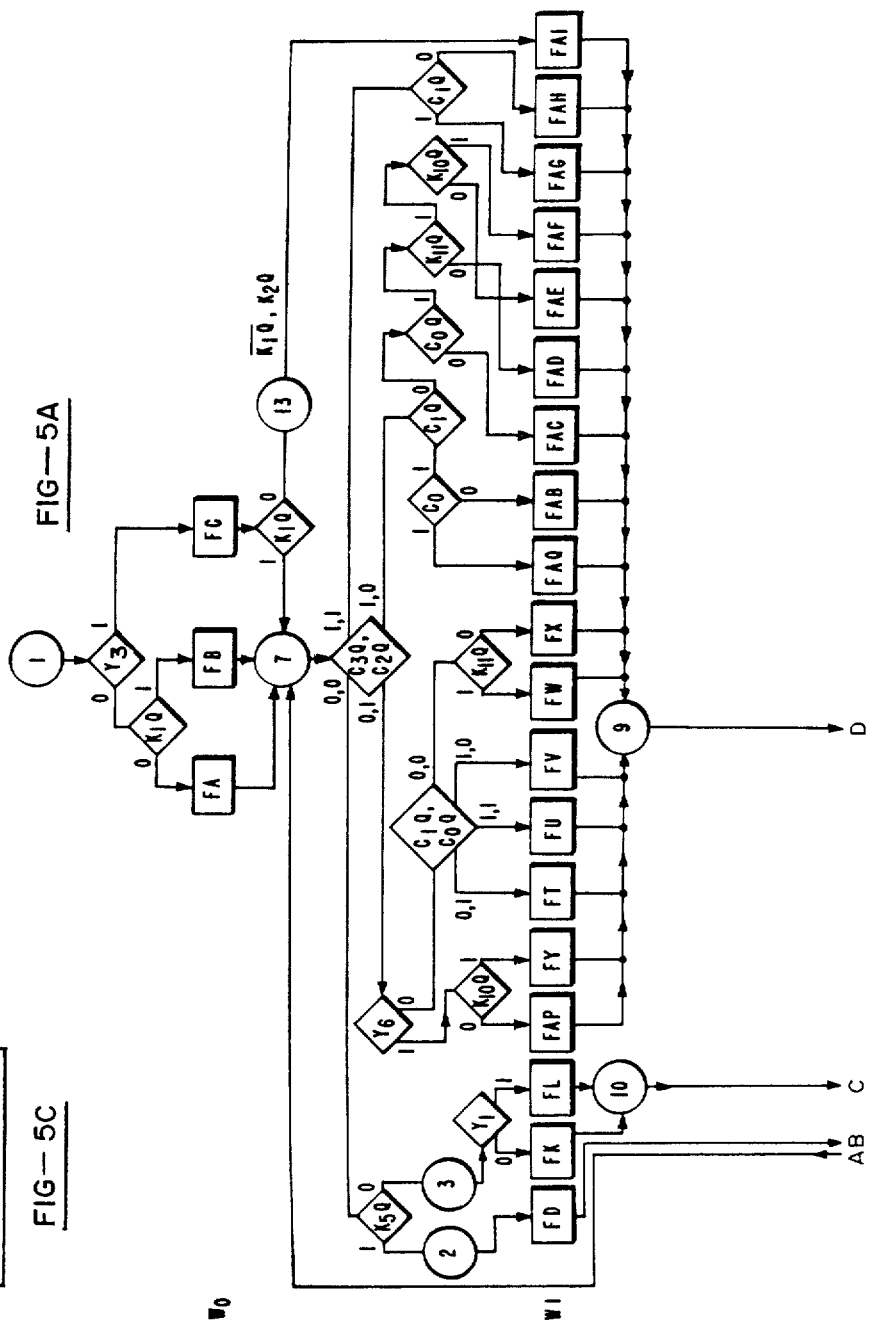

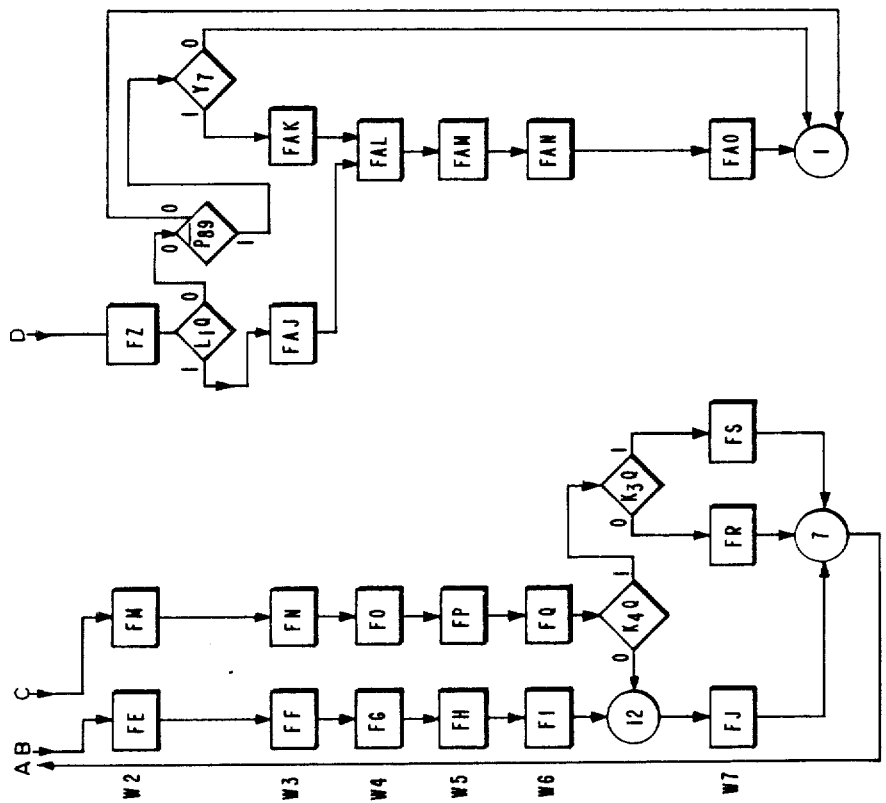
FIG—5B

MONOLITHIC DATA PROCESSOR WITH MEMORY REFRESH

CROSS REFERENCE TO RELATED APPLICATIONS

This application is a divisional of parent application FACTORED DATA PROCESSING SYSTEM FOR DEDICATED APPLICATIONS Ser. No. 101,881 filed on Dec. 28, 1970; wherein the benefit of the filing date of said parent application is hereby claimed in accordance with 35 USC 120 and other authorities therefore; wherein the memory refresh arrangement of the present invention is related to a non-elected invention of said parent application; and wherein said parent application is herein incorporated by reference as if fully set forth at length herein.

BACKGROUND OF THE INVENTION

1. Field of the Invention

This invention is related to stored program data processors and in particular stored program data processors having integrated circuit memories.

2. History of the Prior Art

Prior art data processors typically use magnetic memories such as core memories, thereby precluding a fully integrated circuit computer architecture. Although some prior art computers use integrated circuit memories, these computers use static (non-refreshable) integrated circuit memories in combination with magnetic memories; thereby precluding the advantages achievable with a fully integrated circuit computer and with dynamic (refreshable) integrated circuit memories.

Prior art data processors use core memories for program storage and for operand storage. The non-volatile characteristic of core memories, wherein information is preserved when power is removed, permits a program to be stored and preserved in the core memory. The electrically alterable characteristic of core memories permits operands to be stored and modified in the core memory. Such core memories are not producible with monolithic processes as used to manufacture integrated circuits, where the core memory is typically large, expensive array of discrete elements.

SUMMARY OF THE INVENTION

The present invention is directed towards a monolithic data processor, which is a data processor wherein the digital portions including the memory portions may be produced with monolithic processes. In particular, data processor architecture is provided that permits use of an integrated circuit read only main memory for program storage and an integrated circuit scratch pad memory for operand storage. Therefore, the memory portions of the data processor may be manufactured with integrated circuits to provide an integrated circuit or monolithic data processor.

This Divisional application is specifically directed to the refresh of a dynamic integrated circuit memory feature of the present invention, which will now be described by summarizing various disclosures set forth in the instant application as-filed. Refresh of dynamic memory elements is exemplified by recirculation of the accumulator and scratch pad memories as described in the micro-operation description for the FA, FB, and FC micro-operations herein and as set forth in the $A_{15}D$ and $\overline{A_N Clock}$ logical equation in Table I herein. For example, refresh of "dynamic MOS-FET type integrated circuits" is provided by recirculation, exemplified by recirculation of the "A-Register" and the "SPM-Register" (FA, FB, and FC micro-operation descriptions herein) and further exemplified with the WO terms (implying the FA, FB, and RC micro-operations) in the $A_{15}D$ and $\overline{A_N Clock}$ logical equations (Table I herein).

Therefore, memory information can be refreshed in response to computer sequencing signals such as the WO signal and in response to computer micro-operation signals such as the FA, FB, and FC micro-operation signals to improve data processor utilization of memories.

BRIEF DESCRIPTION OF THE DRAWINGS

A better understanding of the invention may be had from a consideration of the following detailed description, taken in conjunction with the accompanying drawings, which are briefly described below.

FIGS. 2 and 3 have been cancelled herein and are incorporated by reference from the parent application.

FIG. 5 comprises FIGS. 5A, 5B, and 5C; wherein FIGS. 5A and 5B show a micro-operation flow chart for the data processor shown in FIG. 4 and FIG. 5C shows how FIGS. 5A and 5B are connected together.

FIG. 6 comprises FIGS. 6A, 6B, and 6C wherein FIGS. 6A and 6B show a schematic and block diagram representation of the data processor A logic and FIG. 6C shows how FIGS. 6A and 6B are connected together.

FIG. 14 comprises FIGS. 14A, 14B, and 14C wherein FIGS. 14A and 14B are connected together.

FIGS. 16 to 20 have been cancelled herein and are incorporated by reference from the parent application.

DETAILED DESCRIPTION

Introduction

Figure 1:
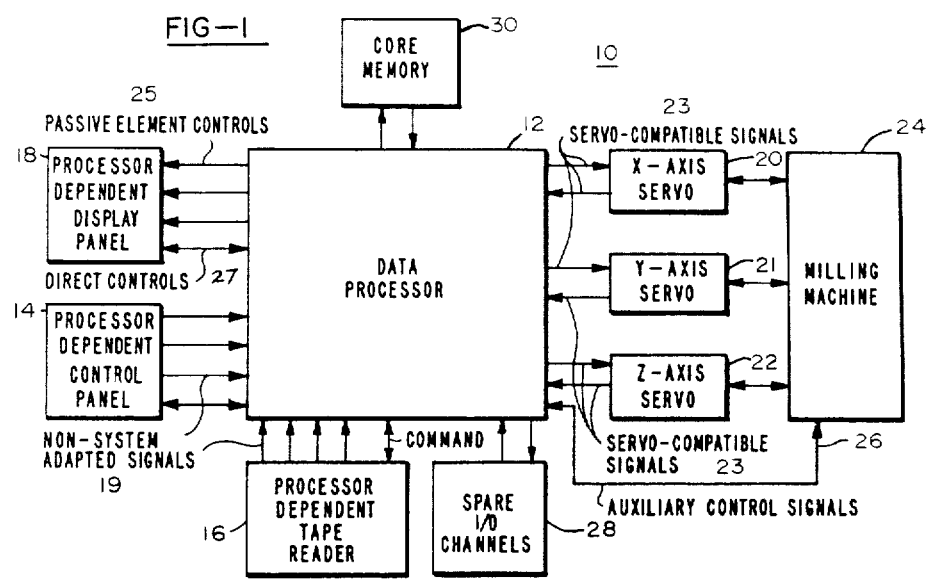
FIG. 1 is a block diagram representation of a numerical control system in accordance with the present invention.
Figure 4:
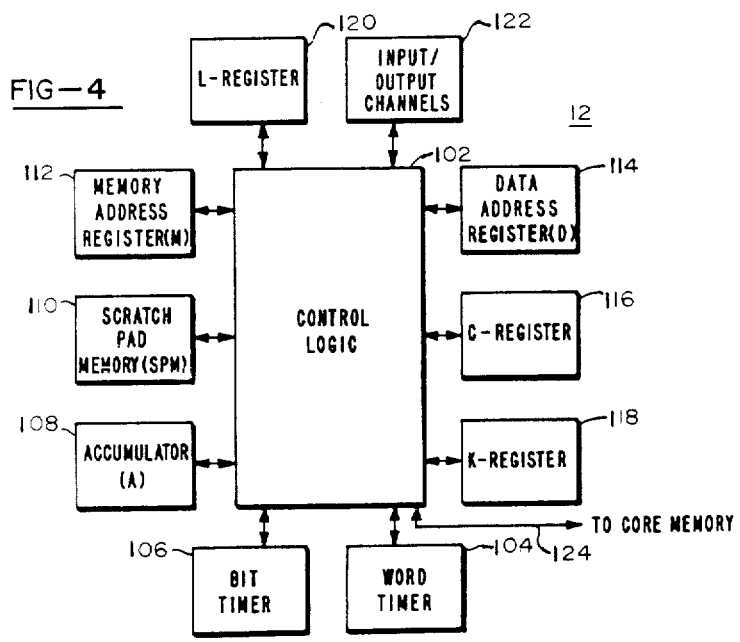
FIG. 4 is a block diagram representation of the data processor shown in FIG. 1.

The system of the present invention is shown in block diagram form in FIG. 1 and the data processor of the present invention is shown in block diagram form in FIG. 4. These block diagrams are discussed in detail in the parent application and are incorporated in the instant application by reference.

The data processor of the present invention is shown in a data processing system in FIG. 1. Data processor 12 communicates with an operator through control panel 14 and display panel 18 and communicates with various peripherals including a tape reader 16, servos 20-22 and a machine 24. A memory 30 provides for storage of a program comprising a plurality of instructions. Spare I/O channels 28 are provided for data processor communication with other devices. Operation of the data processing system 10 is described in detail in the parent application; wherein the instant application is primarily directed to the data processor 12 of data processing system 10 (FIG. 1).

The data processor 12 is shown by way of this example to be used in conjunction with a core memory 30. The basic architecture of this data processor will permit an integrated circuit memory, such as a read-only memory (ROM), or a random-access memory (RAM) or flip-flop type memory to be substituted for the core memory 30 to provide a completely integrated circuit computer which might be called a monolithic computer.

This monolithic data processor can be implemented on a single integrated circuit chip which can include a read only memory, an alterable memory, and program execution circuitry on the same chip.

Data and program storage is provided by a core memory 30 which may be a commercially available memory having Part No. 909838-A01, manufactured by Electronic Memories, Inc. Electronic Memories Inc. drawings 909811-909819 and 910792 show this memory in detail and are incorporated herein by reference. This is an 8-bit 4096 word core memory which is primarily devoted to program storage. Remaining portions may be used for data storage if desired. In this application, the core memory 30 (CM) may be replaced by a read-only memory (ROM) such as a MOS FET read-only memory sold commercially by General Instruments Corporation of Hicksville, N.Y. or a flip-flop memory.

The data processor 12 is organized to operate in a manner somewhat similar to presently known stored program digital computers. The fundamental theory and technology of such presently known systems are described in Chapter 11 of *Digital Computer Design Fundamentals*, Yaohan Chu, McGraw-Hill Book Co., Inc. (New York, 1962); incorporated herein by reference.

The data processor 12 is organized to process 8 bit words with most working and storage registers having a 16 bit capacity permitting the storage of two words. Serial transfer of data is used throughout the data processor 12 to minimize the logic and interconnections required.

The data processor 12 includes a 12 bit memory address register (M Register) which defines a memory location being accessed in the main memory 30. A memory data register (D-Register) defines an operand location such as in the scratch pad memory and input/output (I/O) channels. Thirty two Scratch Pad Memory (SPM) Registers provide convenient intermediate storage, independent of the main memory. A three bit counter divides the execution of program instructions into word times and a four bit counter subdivides the word times into bit times, the basic operating intervals.

The data processor operates by executing programmed instructions received from the main memory. When an instruction is received, control logic causes the data processor to progress through a matrix of micro operations, the exact path varying with the instruction being executed. Each micro operation occurs during one of the eight possible word times, 0 thru 7, and performs a micro operation portion of the instruction being executed. Upon completion of the FZ micro operation, the data processor recycles through the matrix including flow diagram paths L1Q and P89; or L1Q, P89, and Y7; or L1Q, FAJ, FAL, FAM, FAN, and FAO: or L1Q, P89, Y7, FAK, FAL, FAM, FAN, and FAO as shown in FIG. 5B to begin execution of the next instruction.

The following description of the system, as will be evident to those skilled in the art, comprises a complete definition of a preferred embodiment in accordance with the invention. In order to simplify the description and drawings, extensive use has been made of logical equations, which per se are definitive of detailed circuit elements and interconnections for a specific system, in accordance with modern integrated circuit techniques and is well known to those skilled in the art. In order to simplify the description, extensive and orderly reference is made to principal micro operations, both in the form of the states of major subsystems at particular points in time during these micro operations as well as in the form of the sequences and purposes of each micro operation. The totality of these principal micro operations completely define the operation of this processor system.

The control panel 14 and display panel 18 and in particular, the refreshable display are disclosed in detail in parent application Ser. No. 101,881 as amended and in related application Ser. No. 101,449 as-amended; both filed on Dec. 28, 1970. Related application Ser. No. 101,449 was abandoned in favor of continuing application Ser. No. 354,590 filed on Apr. 24, 1973 having the same disclosure thereof as-filed; which is now U.S. Pat. No. 4,038,640 issued on July 26, 1977; a copy thereof having been incorporated into the file wrapper hereof.

Data Processor

As shown in FIG. 1, the data processor 12 receives data from the various input sources, performs calculations or otherwise manipulates data in accordance with the input information and outputs processed information to control the milling machine 24 through servos 20, 21 and 22 and auxiliary control signals 26. The data processor is built from series SN7400 integrated circuits manufactured by Texas Instruments, Inc. which are located on a series of printed circuit boards. These printed circuit boards plug into a Mother board which provides necessary interconnections between the terminals of the printed circuit boards.

The architecture of the data processor 12 lends itself to a fully integrated circuit computer mainframe where all of the logic may be implemented with integrated circuits in a conventional manner and additionally includes an integrated circuit scratch pad memory (SPM). Further, this data processor 12 has the architecture to use an integrated circuit read-only memory (ROM) in place of or in addition to a core memory such as for the main memory 30 providing a data processor with the digital portion constructed wholly of integrated circuit components.

In a somewhat simplified block diagram, the data processor 12 is shown in FIG. 4 as control logic 102 interconnecting registers, timers and communication channels. Common signal definitions are provided in FIGS. 5 through 15 and Tables I and II to permit those knowledgeable in the art to identify the various connections between logical elements and circuit boards.

Figure 7:
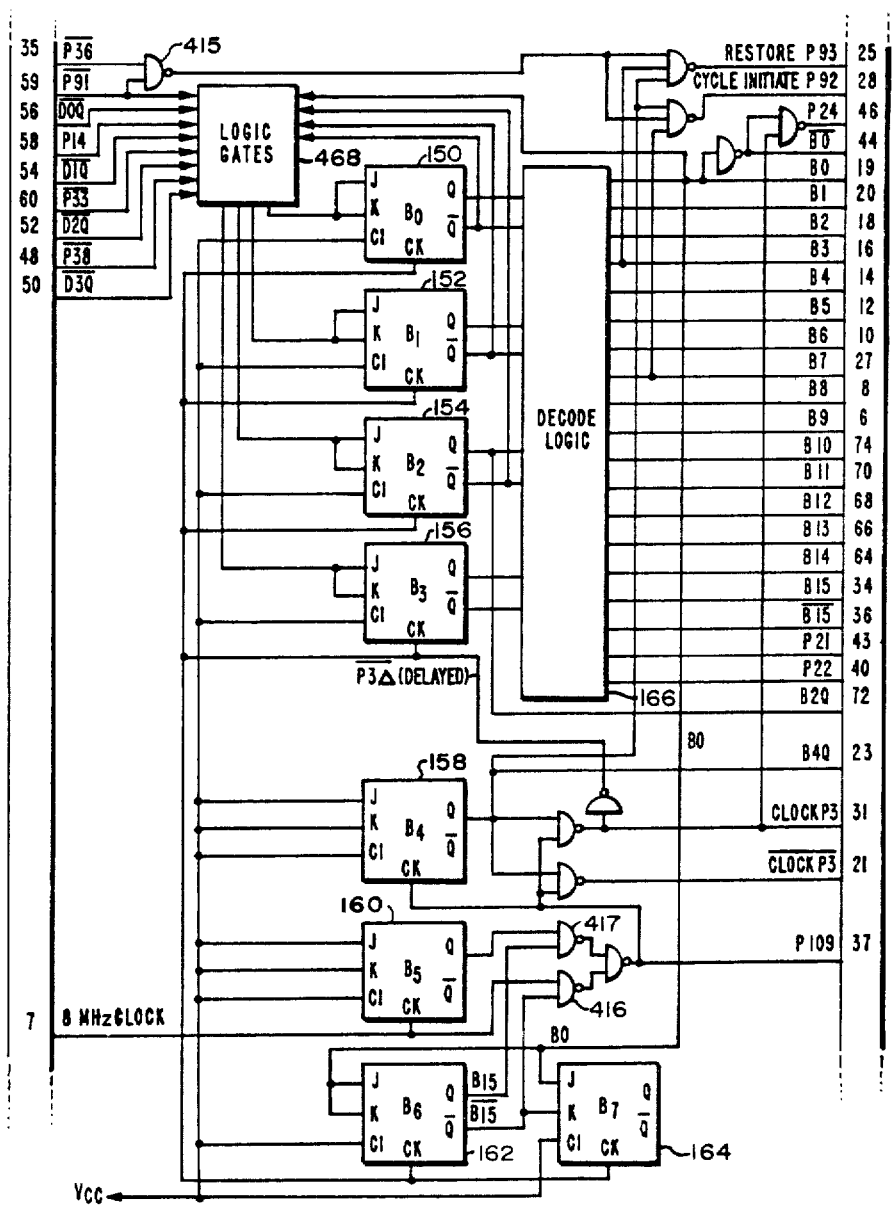
FIG. 7 is a schematic and block diagram representation of the data processor B logic.
Figure 11:
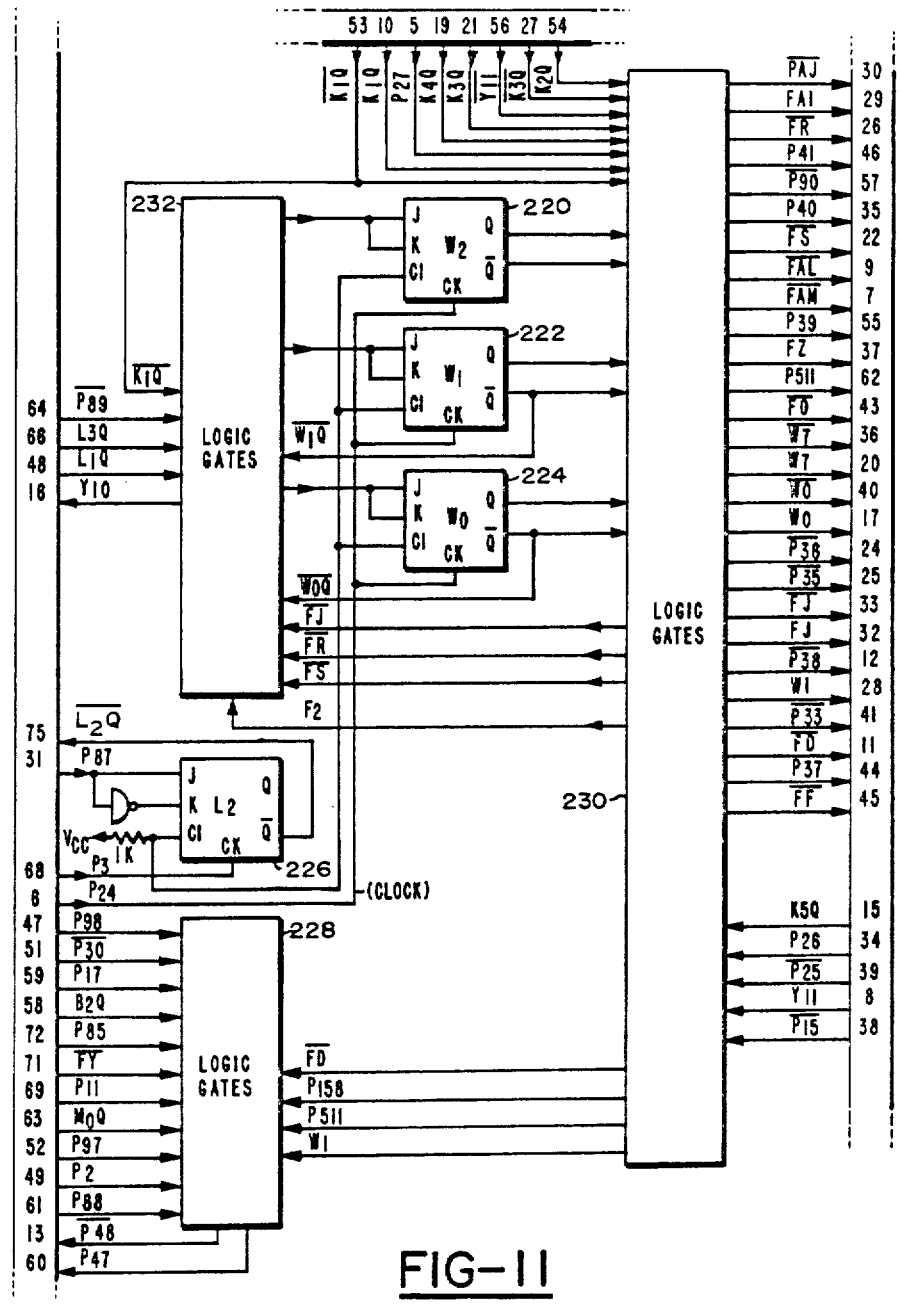
FIG. 11 is a schematic and block diagram representation of the data processor W logic.

The basic timing functions of the data processor 12 are performed by a word timer 104 (FIG. 4) and $W_0$-$W_2$ (FIG. 11) and a bit timer 106 (FIG. 4) and $B_0$-$B_3$ (FIG. 7). The fundamental synchronization of the data processor 12 is provided by an 8 MHz clock signal (FIG. 7) which is included as part of the control logic 102. The synchronizing clock signal is an asymmetric square wave, the positive portion of which is designated $\overline{P_3}$ and the negative portion of which is designated $P_3$. The asymmetrical character of the clock signal permits a longer clock period for stabilization of propagation delays without sacrifice of processing speed. The word timer 104 (FIG. 4) and $W_0$-$W_2$ (FIG. 11) is a three-bit counter with associated decode logic (FIG. 11). It counts from 0 to 7 as the data processor cycles through the micro operations (FIG. 5) during the execution of an instruction with each micro operation being performed in a different word time. The associated decode logic provides eight output lines, each being true during one of the eight different counting states of the word timer 104 (FIG. 4) and $W_0$-$W_2$ (FIG. 11). These output signals are used by the control logic 102 (FIG. 4) including logic gates 230 (FIG. 11) for sequencing the data processor through the micro operations associated with an instruction. The bit timer 106 (FIG. 4) and $B_0$-$B_3$ (FIG. 7) is a four-bit binary counter $B_0$-$B_3$ (FIG. 7) with associated decode logic. The bit timer 106 (FIG. 4) and $B_0$-$B_3$ (FIG. 7) counts down from 15 thru 0 and consequently the associated decode logic 166 (FIG. 7) has 16 output lines $B_0$-$B_{15}$ (FIG. 7), each going true during a different one of the 16 possible counts of the bit timer 106 (FIG. 4) and $B_0$-$B_3$ (FIG. 7). The bit timer 106 (FIG. 4) and $B_0$-$B_3$ (FIG. 7) provides sequencing and timing within a given micro operation or word time.

Figure 6A:
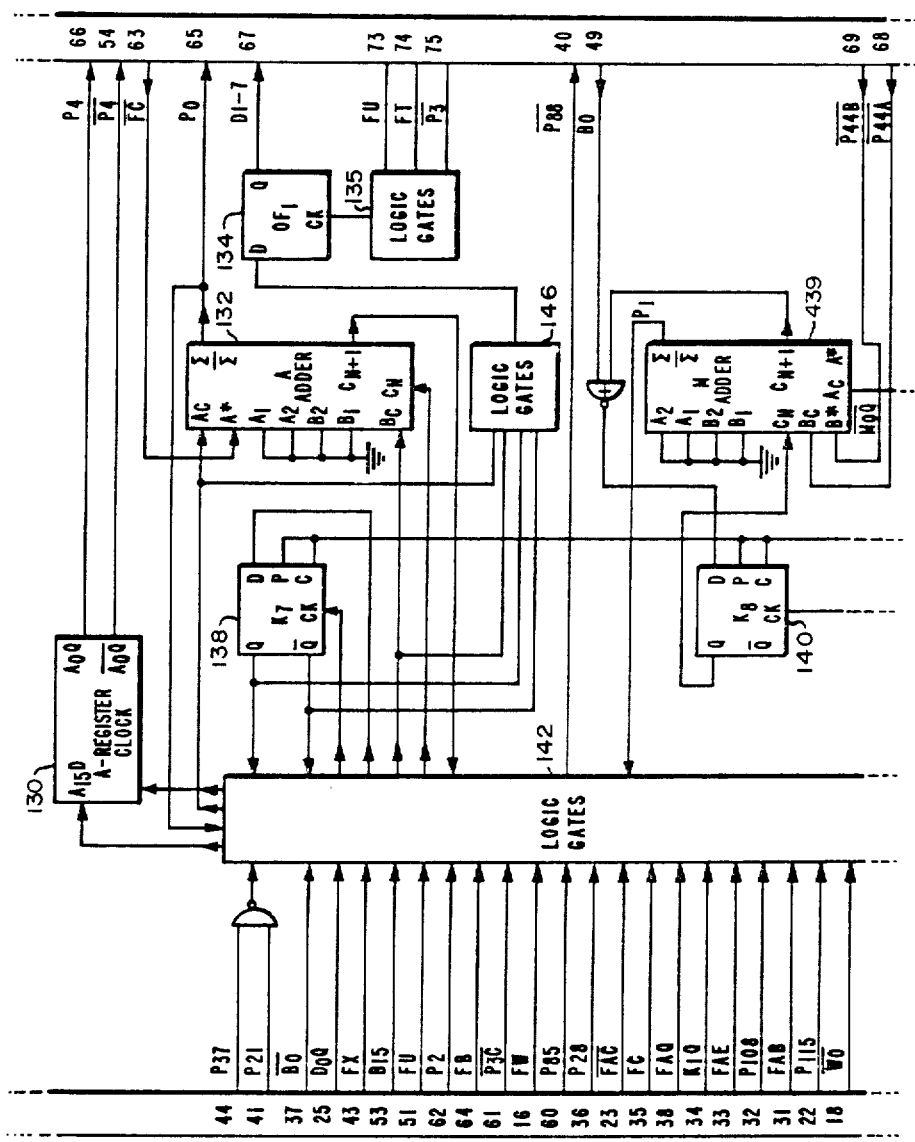

An accumulator (A-register) 108 (FIG. 4) and 130 (FIG. 6A) is the basic arithmetic register and is used as the repository of the results of arithmetic and logical operations. It is also the source and destination of the input/output (I/O) parameters. The A-register 108 (FIG. 4) and 130 (FIG. 6A) is a 16 bit serial in, serial out shift register (FIG. 6). Associated with the A-register 108 (FIG. 4) and 130 (FIG. 6A) is a serial full adder 132 (FIG. 6A) which in FIG. 4 is included within the control logic 102.

Figure 12:
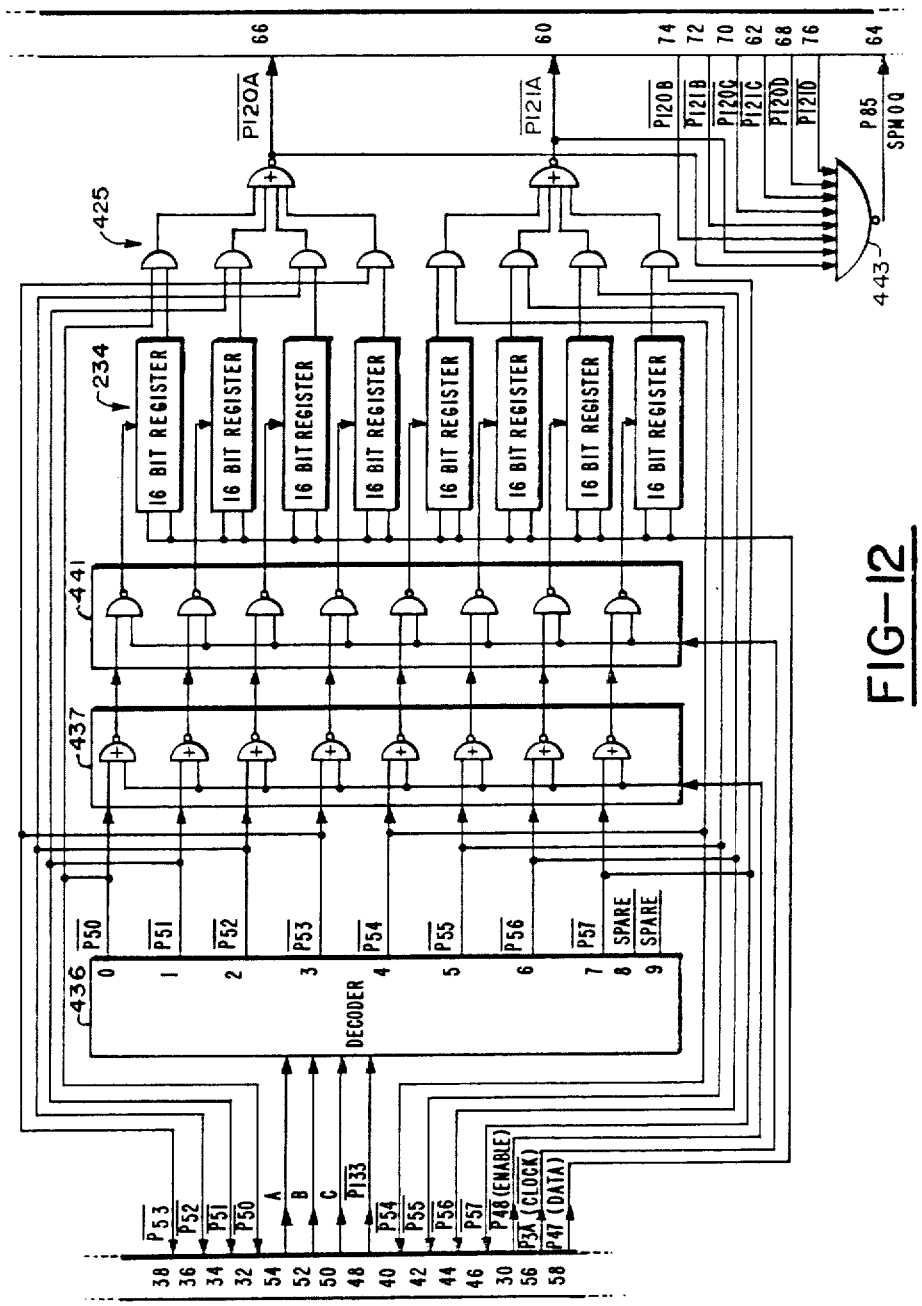
FIG. 12 is a schematic and block diagram representation of the data processor SPM logic.

A scratch pad memory (SPM) 110 FIGS. 4 and 12 provides storage operands such as for intermediate parameters such as computational results, return addresses, indexes and other pertinent information. The SPM 110 main is a group of 32 16 bit serial in, serial out registers which are divided into two pages with 16 registers 234 (FIG. 12) on each page or block (FIG. 12). Paging is accomplished by toggling the $I_1$ flip-flop flip-flop I1 (FIG. 13), which is toggled by the discrete output instruction DO-8 to chance SPM pages, and which is automatically set to page 0 when the power is turned on. When the SPM 110 (FIGS. 4 and 12) is set to page 0, the data processor acts as if page 1 did not exist; and similarly, when the SPM is set to page 1, the data processor acts as if page 0 did not exits. All of the SPM registers can be used for the storage of information, but some of them are primarily associated with specific functions to increase the efficiency of the data processor. The $SPM_0$ register is generally used as a TX instruction register (decrement and transfer on non-negative) where the index byte to identify the $SPM_0$ register is automatically assumed and need not be programmed in conjunction with the TX instruction. The $SPM_2$ register is used for the return address associated with the execution of transfer-type instructions. In addition, the $SPM_2$ register is used as the intermediate register for operands obtained from the constant memory portion of the main memory. The first eight SPM registers can be used for index or TX instructions in addition to scratch pad operations.

Figure 6B:
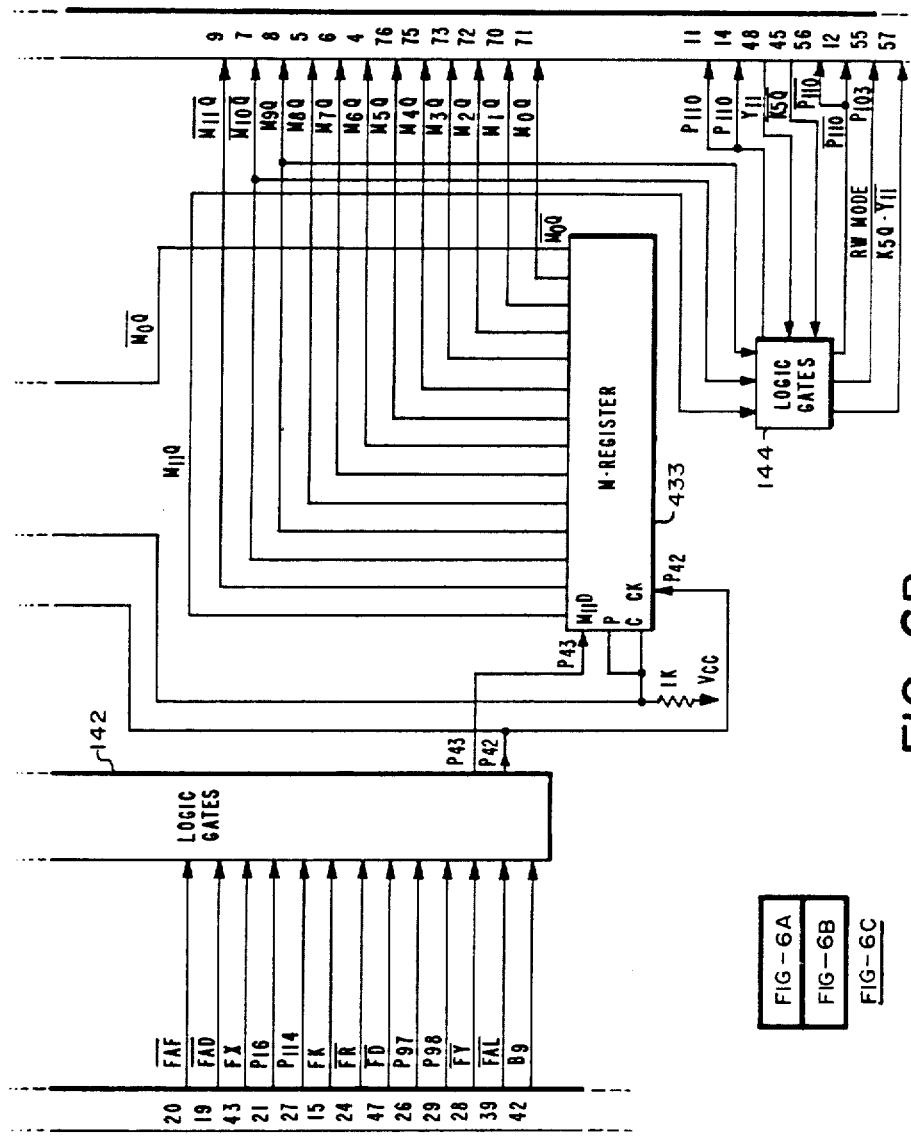

A memory address register (M-register) 112 (FIGS. 4 and 6B) holds the 12 bit address $M_0Q$-$M_9Q$, $\overline{M_{10}Q}$ and $\overline{M_{11}Q}$ (FIG. 6B) of an eight-bit byte to be accessed from the program memory (FIG. 6). The 11-register 112 (FIGS. 4 and 6B) is a 12-bit shift register having the capacity to address up to 4,096 different memory locations. It has a serial input $M_{11}D$ (FIG. 6B) and both serial and parallel outputs $M_0Q$-$M_9Q$, $\overline{M_{10}Q}$, and $\overline{M_{11}Q}$ (FIG. 6B). Associated with the M-register 112 (FIGS. 4 and 6B) but represented as being within the control logic 102 is a serial full adder (FIG. 6A) which increments the M-register 112 (FIGS. 4 and 6B) to access sequential instructions or, as applicable, the next two bytes of in-line instructions. The M-register 112 (FIGS. 4 and 6B) is incremented by two for a TX instruction when the condition for that transfer is not met, resulting in a skip of two bytes. The M-register 112 (FIGS. 4 and 6B) is incremented by three for a skip-on-discrete (SD) instruction. The M-register 112 (FIGS. 4 and 6B) is exchanged with the $SPM_2$ register for transfer type instructions and exchanged with a data address register (D-register) 114 (FIG. 4) and 186 (FIG. 9) to access operands from the main memory. The M-register 112 (FIGS. 4 and 6B) is also exchanged with the $SPM_2$ register at the start of an ST instruction which causes the contents of the A-register 108 (FIG. 4) and 130 (FIG. 6A) to be stored in the main memory when implemented with a core memory.

The data address register (D-register) 114 (FIG. 4) and 186 (FIG. 9) is a 12 bit shift register 186 (FIG. 9) that usually contains an operand address and is used to select: (a) SPM register, (b) I/O channel, and (c) number of shifts, depending upon the type of instruction being executed. The D-register 114 (FIG. 4) and 186 (FIG. 9) has a serial input $D_{11}$ (FIG. 9) and serial output $D_0Q$ (FIG. 9), with the eight least significant bits $D_0Q$-$D_7Q$ (FIG. 9) having parallel outputs.

Figure 8:
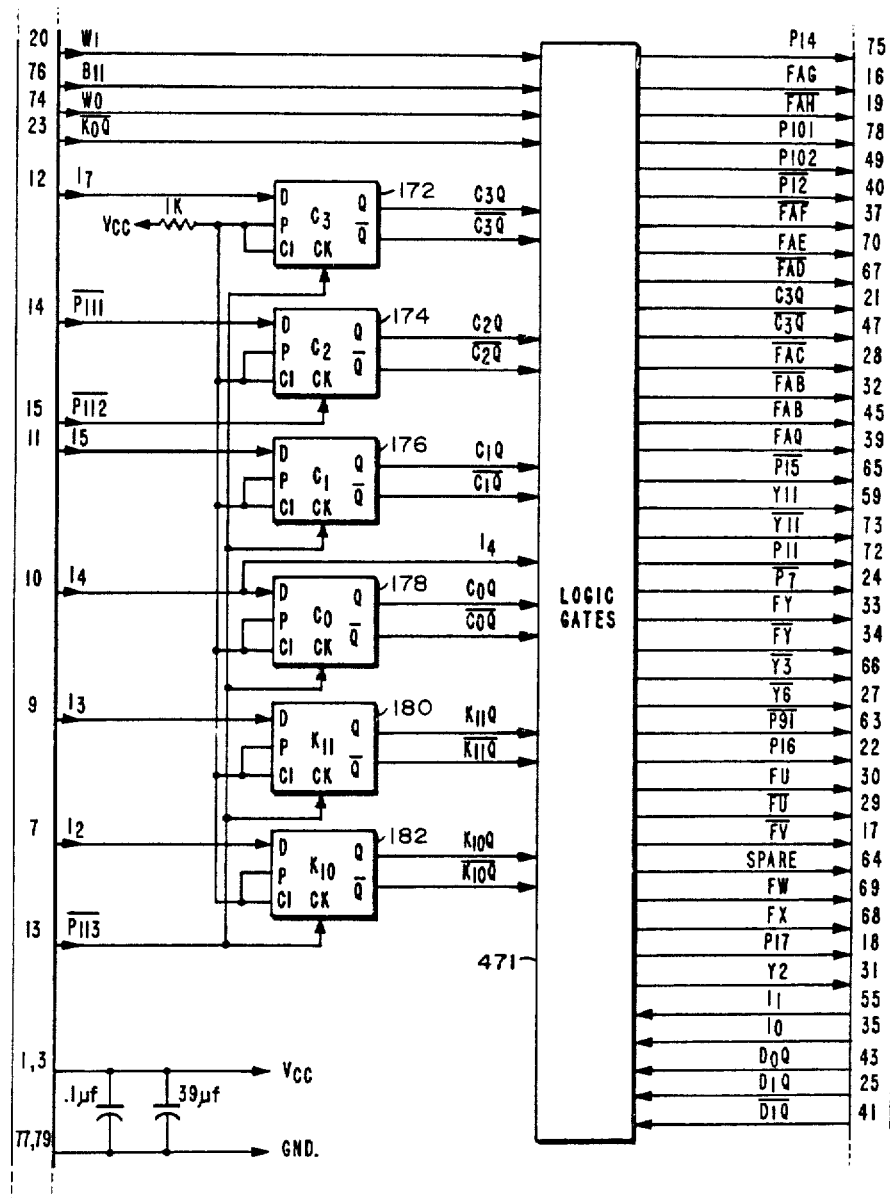
FIG. 8 is a schematic and block diagram representation of the data processor C logic.

A C-register 116 (FIG. 4) is composed of six flip-flops designated $C_3$, $C_2$, $C_1$, $C_0$, $K_{11}$, and $K_{10}$ (FIG. 8) which store the six most significant bits of an eight-bit instruction byte obtained from program memory (FIG. 8). The $C_3$, $C_2$, $C_1$, $C_0$, $K_{11}$, and $K_{10}$ flip-flops store the instruction bits designated $I_7$, $I_6$ (included in the P111 signal), $I_5$, $I_4$, $I_3$ and $I_2$, respectively as received from the main memory interface lines (I). These instruction bits are held by the C-register 116 (FIGS. 4 and 8) during the performance of an instruction to control the sequence of micro operations executed during the performance of the instruction.

An element designated K-register 118 (FIGS. 4 and 10) is a group of miscellaneous flip-flops (FIG. 10) for various functions. The $K_0$, $K_1$ and $K_2$ flip-flops (FIG. 10) are used to control sequencing through the micro operations. The $K_1$ flip-flop is also used to store the sign of the operand in the A-register 108 (FIG. 4) and 130 (FIG. 6A) and the sign of a decremented number during a TX instruction. The $K_2$ flip-flop is also used to extend the A-register during a shift left operation where the $K_2$ flip-flop acts as the $A_{-1}$ stage of the A-register. The $K_3$, $K_4$, and $K_5$ flip-flops (FIG. 10) may be grouped together and designated the KA-register and may be used to store the address of the index. The KA-register is also used as an extension of the A-register during a shift left operation with $K_3$ as the $A_{-2}$ stage, $K_4$ as the $A_{-3}$ stage, and $K_5$ as the $A_{-4}$ stage of the A-register 108 (FIG. 4) and 130 (FI. 6A). The $K_7$ flip-flop 138 (FIG. 6A) is used as a carry flip-flop in conjunction with the A-register 108 (FIG. 4) and 130 (FIG. 6A) full adder 132 (FIG. 6A). It is also used in the FK micro operation in the transfer of the D-register 114 (FIG. 4) and 186 (FIG. 9) contents to the M-register 112 (FIGS. 4 and 6B) as a shift left operation to multiply the D-register word address by two to obtain the M-register byte address. The $K_8$ flip-flop 140 (FIG. 6A) is used as a carry flip-flop in conjunction with the M-register full adder 139 (FIG. 6A). As previously described, the $K_{10}$ and $K_{11}$ flip-flops 182 and 180 (FIG. 8) form the two least significant bits of the C-register 116 (FIGS. 4 and 8).

An element designated L-register 120 (FIG. 4) is, like the K-register 118 (FIGS. 4 and 10), a group of miscellaneous flip-flops performing control functions. The most significant is the $L_1$ flip-flop 210 (FIG. 10) which controls turn-on and turn-off of the data processor.

Input/output (I/O) channels 122 (FIGS. 4 and 13) include whole number and discrete channels. The whole number channels connect the A-register 108 (FIG. 4) and 130 (FIG. 6A) with the various entities and extremities. The whole number I/O channels (FIGS. 4 and 13) (FIG. 13) are arranged in pairs so that as the output from the least significant bit ($A_0Q$) (FIGS. 6A and 13) of the A-register 108 (FIG. 4) and 130 (FIG. 6A) shifts information to an output channel (ow) and a corresponding input channel (IW) simultaneously shifting information into the A-register 108 (FIG. 4) and 130 (FIG. 6A) through the input to the most significant bit $A_{15}D$ (FIG. 6A).

A data path 124 provides two-way communication between the data processor and the main memory. This path carries the main memory address stored in the M-register and transfers stored words to or from the main memory.

Micro-Operations

The operation of the data processor in carrying out an instruction can best be understood by examining the micro-operation flow chart shown in FIG. 5. The small rectangles represent micro-operations in accordance with the letter designation therein and the diamonds represent alternative conditions. If the condition or function contained within a diamond is true, the patch designated 1 is taken. Otherwise, the path designated 0 is taken. The micro-operations are arranged in parallel rows according to the word time in which they occur. For instance, the FA, FB and FC micro-operations occur in word time W0, while the row of micro-operations beginning with FD and FK occur during the W1 word time. Each micro-operation consists of one or more bit times to define the number of clock pulses used to execute that micro-operation and summarized in Table V. The word and bit times are presented with the following description of each micro-operation. The circled numbers are provided as references for ease of understanding and discussion.

During the execution of a program instruction, the data processor begins at point 1 at the top center of FIG. 5. The first branch condition is $Y_3 = \overline{C_3Q} \cdot \overline{C_2Q} \cdot C_1Q \cdot \overline{C_0Q} \cdot \overline{K_{11}Q} \cdot K_{10}Q \cdot I_1 \cdot \overline{I_0}$, which represents the operation code for a TX instruction. If this term is true, the FC micro-operation is performed; if not true, a second control condition is tested. If flip-flop $K_1$ is in the 0 state, the FA micro-operation is executed and if it is in the 1 state, the FB micro-operation is executed. In similar fashion, a series of micro-operations are executed in accordance with the programmed instruction until the micro-operation FZ is completed. At this point the power-interrupt flip-flop $L_1$ determines whether or not the execution of programmed instructions continues to reference point 1. If the $L_1$ flip-flop is in the 1 state indicating an interrupt, a series of micro-operations is entered which place the return address in $SPM_2$ and loads the interrupt routine address into the M-register. If the $L_1$ flip-flop is in the 0 state indicating a non-interrupt condition, the processor returns to point 1 and begins the execution of another program instruction unless an X5 signal indicates that there is an external interrupt. If there is an external interrupt, the data processor ignores it, returning to point 1 unless the interrupt override flip-flop $L_3$ is true and the flip-flop $K_1$ is in the false state.

Each micro-operation will now be described in detail including the logical equations (summarized in Table III) which determines whether a micro-operation is true or false, the word time in which it occurs (summarized in Table V), the bit times in each micro-operation (summarized in Table V), a brief written description of the micro-operation, and a shorthand notation of what functional operations are performed by each micro-operation. In describing the micro-operations and throughout this application, a flip-flop or register bit designation followed by a Q indicates an output. If there is no bar over the term, the true or 1 state of the output is indicated; and if there is a bar over the term, the 0 or false state of the output is indicated. Similarly, a flip-flop or register bit designation followed by a D, T, J, or K indicates the input to the designated flip-flop and the flip-flop synchronizing clock pulse input is designated "clock". For instance, the term $L_1T$ indicates the toggle input to the $L_1$ flip-flop while the term $\overline{A_0Q}$ indicates a 0 or false output from the $A_0$ bit of the A-register which is the least significant bit. In addition, the following commonly used symbols will be used throughout this application.

| Symbol | Description of Symbol |
|---|---|
| ( ) | Parenthesis denote contents of a register. |
| [ ] | Square brackets denote a portion of a register, the contents of which has a functional dependence upon a register Thus I[D] means instruction part of the D-Register. Op[D] means operation part of D-Register. Ad[M] means address part of M-Register. Sn[A] and Mg[A] means sign and magnitude parts of A-Register, respectively. |
| M<A> | This symbol denotes a location of a memory word addressed by the A-Register. |
| (M<A>) | This symbol denotes the contents of a memory word addressed by the A-Register. |
| → | Denotes transfer of a word from one register to another. Thus, (A)→M means that the contents of the A-Register is transferred to the M-Register. (A)→PM<M> means that the contents of the A-Register is transferred to the program memory location addressed by the M-Register. |
| + | This symbol represents a logical-OR operation. |

-continued

| Symbol | Description of Symbol |
|---|---|
| . | This symbol represents a logical-AND operation. |
| : | Colon following a variable (representing a state or the command) denotes the occurrence of the subsequent statement when the value of the variable is 1. |
| PM | Program (main) memory which may be a core memory or an ROM. |
| SPM | Scratch pad memory. |

A detailed description of each micro-operation follows.

$FA = W0 \cdot \overline{K_1Q} \cdot (B15 \cdot Y3 + K_2Q)$

The FA micro-operation occurs in the W0 word time and has a length of 16 bit times. It is used for all instructions that are not preceded by an index byte nor are TX (decrement and transfer) instructions. The following operations take place during this micro-operation:

$(M)+1 \rightarrow M$ at B11 thru B0

The address in the M-Register is incremented by 1 in the last 12 bit times to eliminate a race, if a ROM is used, with the scanout of the instruction bits ($I_i$) from the memory instruction register into the D-Register.

$Ad[I] \rightarrow D$ at B15 thru B11

If dynamic MOS-FET type integrated circuits are used, they are refreshed by recirculation at bit times B15 thru B0.

$Sn[A] \cdot C_3Q \rightarrow K_1$ at B0

The A-Register is recirculated to refresh it if MOS-FET type integrated circuits are used and to make the sign bit, which is the most significant bit, available to $K_1$ in case $C_3Q$ is true.

$0 \rightarrow K_3, K_4, K_5$ at B0

$0 \rightarrow K_8$ at B0

This is the M carry flip-flop which is used to increment the address in the M-Register during this micro-operation and it is reset at B0.

$FB = W0 \cdot K_1Q \cdot (B15 \cdot Y3 + K_2Q)$

The FB micro-operation occurs during the W0 word time and has a duration of 16 bit times. It is used for all instructions preceded by an index byte with the exception of the TX (decrement and transfer) instruction. The following operations take place during this micro-operation:

$(M)+1 \rightarrow M$ at B11 thru B0

The address stored in the M-Register is incremented during the last 12 bit times to eliminate a race, if a ROM is used, with the scanout of the contents of the memory instruction register (I) into the D-Register.

$Ad[I] + (SPM < K_3, K_4, K_5 >) \rightarrow D$ at B15 thru B0

This operation clocks the index which was stored in the designated SPM-Register, causing it to be added to the instruction operand address. The sum is loaded into the D-Register.

$C_3Q: Sn[A] \rightarrow K_1$ at B0

The A-Register is recirculated to refresh if dynamic MOS-FET type integrated circuits are used and to clock the sign bit of the A-Register, which is the most significant bit, into the $K_1$ flip-flop.

$0 \rightarrow K_3, K_4$ at B0

$Y2 \rightarrow K_5$ at B0

The $K_3, K_4$ and $K_5$ flip-flops hold the address of the selected SPM-Register during this micro-operation and are reset at the end. The Y terms are defined in Table II.

$0 \rightarrow K_7$ at B0

This is the A carry flip-flop which is not used during this micro-operation.

$0 \rightarrow K_8$ at B0

This is the M carry flip-flop which is used to increment the address stored in the M-Register and is reset at B0.

$FC = W0 \cdot (B15 \cdot \overline{C_3Q} \cdot \overline{C_2Q} \cdot C_1Q \cdot \overline{C_0Q} \cdot \overline{K_{11}Q} \cdot K_{10}Q \cdot I_1 \cdot \overline{I_0} + K_2Q)$ The FC micro-operation occurs during the W0 word time and has a duration of 16 bit times. It is used for all TX (decrement and transfer) instructions. The operations executed during this micro-operation are as follows:

$(M)+1 \rightarrow M$ at B11 thru B0

The address in the M-Register is incremented in the last 12 bit times to eliminate a race, if a ROM is used, with the scanout of the instruction bits ($I_i$) from the memory instruction register into the D-Register.

$Ad[I] \rightarrow D$ at B15 thru B11

The address portion of the memory instruction register (I) is scanned into the D-Register during the last six bit times.

The SPM-Registers are circulated to refresh them if dynamic MOS-FET type integrated circuits are used.

$0 \rightarrow K_3, K_4, K_5$ at B0

These flip-flops hold the address of the index register during this micro-operation and are reset at B0.

$0 \rightarrow K_7$ at B0

This is the A-Register carry flip-flop and is reset at B0.

$0 \rightarrow K_8$ at B0

This is the M-Register carry flip-flop and is reset at B0.

$FD = \overline{C_3Q} \cdot \overline{C_2Q} \cdot K_5Q \cdot W1$

The FD micro-operation occurs at word time 1 and has a duration of 12 bit times. It is used for a core memory ST (store) instruction. The operations executed during this micro-operation are as follows:

$(SPM<2>)_{lsh} \rightarrow M$ at B11 thru B0

The 12 least significant bits of the SPM-2 Register are clocked into the M-Register as these two registers are interchanged.

$(M) \rightarrow SPM<2>$ at B11 thru B0

The contents of the M-Register is clocked into the 12 most significant bit positions of the SPM-2 Register as part of the interchange of these two registers.

$(A)_{lsh} \rightarrow A_{msh}$ at B11 thru B4

$(A)_{lsh} \rightarrow D_{msb}$ at B11 thru B4

$(A)_{msh} \rightarrow A_{lsh}$ at B11 thru B4

During the first eight bit times the A-Register is half circulated, moving the most significant half (msh) to the least significant half (lsh) and the least significant half to the most significant half. At the same time, the contents of the least significant half of the A-Register are transferred to the eight most significant bit positions (msb) of the D-Register.

$0,0,0,0,0 \rightarrow D$ at B3 thru B0

During the last four bit times, the operand stored in the most significant bit positions of the D-Register are shifted into the least significant bit positions and four zeros are shifted into the D-Register.

$FE = \overline{C_3Q} \cdot \overline{C_2Q} \cdot K_5Q \cdot W2$

The FE micro-operation occurs during the W2 word time and has a duration of eight bit times. It is used for a core memory ST (store) instruction. The operations executed within this micro-operation are as follows:

(D)$_{lsb}$→PM<M> at B7 thru B0
Write Strobe at B7
This write strobe at the beginning of the micro-operation permits the eight least significant bits of the D-Register to be clocked into the memory as they are clocked out of the D-Register.
0→SPM<2> at B7 thru B4
The contents of the M-Register transferred to the most significant bit positions during the FD micro-operation are shifted into the 12 least significant bit positions.

$FF = \overline{C_3Q} \cdot \overline{C_2Q} \cdot K_5Q \cdot W3$

The FF micro-operation occurs during the W3 word time and has a duration of 1 bit time. It is used to fill out the word times and no operations take place during this micro-operation.

$FG = \overline{C_3Q} \cdot \overline{C_2Q} \cdot K_5Q \cdot W4$

The FG micro-operation occurs during the W4 word time and has a duration of 12 bit times. It is used with a core memory ST (store) instruction and loads the second operand byte into the D-Register while incrementing the M-Register to address the main memory location where the second byte is to be stored. The operations performed within this micro-operation are as follows:

(M)+1→M at B11 thru B0
(A)$_{lsh}$→A$_{msh}$ at B11 thru B4
This completes the recirculation of the A-Register begun in the FD micro-operation.
(A)$_{lsh}$→D$_{msb}$ at B11 thru B4
As recirculation of the A-Register is completed, the second byte of the operand is recirculated and shifted into the most significant bit positions of the D-Register.
0→D at B3 thru B0
The second byte of the operand is shifted into the eight least significant bit positions and zeros are shifted into the most significant bit positions of the D-Register.
0=K$_8$ at B0
This is the M carry flip-flop which is reset after the M-Register is incremented.

$FH = \overline{C_3Q} \cdot \overline{C_2Q} \cdot K_5Q \cdot W5$

The FH micro-operation occurs during the W5 word time and has a duration of eight bit times. It is a continuation of a core memory ST (store) instruction and places the second byte of the operand into core memory. The operations executed during this micro-operation are as follows:

Write Strobe at B7
(D)$_{lsb}$→PM<M> at B7 thru B0
Following a Write Strobe, the second byte of the operand is shifted from the D-Register into the location in core memory addressed by the M-Register.

$FI = \overline{C_3Q} \cdot \overline{C_2Q} \cdot K_5Q \cdot W6$

The FI micro-operation occurs during the W6 word time and has a duration of eight bit times. It is used to fill out the eight word times of a core memory ST (store) instruction cycle and no functions are executed.

$FJ = \overline{C_3Q} \cdot \overline{C_2Q} \cdot (\overline{K_4Q} + K_5Q) \cdot W7$ The FJ micro-operation occurs during the W7 word time and has a duration 12 bit times. This micro-operation sets the necessary control flip-flops to cause the FY or FAP micro-operations to be executed next. The functions executed are:

0001→D$_3$D$_2$D$_1$D$_0$ at B12 thru B0
This makes Y6 true so that the proper branch will be followed after point 7 on the micro-operation flow chart, FIG. 5.
1→C$_2$ at B0
This sets the C$_3$, C$_2$ flip-flops to the 0, 1 state causing the proper micro-operation flow path to be followed after point 7 on the micro-operation flow chart, FIG. 5.
0→K$_1$, K$_2$, K$_3$, K$_4$, K$_5$ at B0
0,0,1→W$_2$, W$_1$, W$_0$ at B0
The word timer is set to word time 1 to cause the next micro-operations executed to be the FAP and FY micro-operations which follow.

$FK = \overline{C_3Q} \cdot \overline{C_2Q} \cdot \overline{K_5Q} \cdot (B11 \cdot Y1 + K_3Q) \cdot \overline{FAI} \cdot W1$ The FK micro-operation occurs in the W1 word time and has a duration of 12 bit times. It is used exclusively for the instructions that obtain the operand or transfer address from program memory. This micro-operation is used during the DP, BP, XP, and AP instructions that obtain the operand from the constant memory portion of the program memory. This micro-operation is used to place the operand word address, multiplied by two to provide the operand byte address, in the M-Register and to preserve the next instruction-address in the D-Register. The operations which are executed are as follows:

(D)→K$_7$ at B1 thru B0
(K$_7$)→M at B11 thru B0
(M)→D at B11 thru B7
The effect of these three transfers is to exchange the contents of the D- and M-Registers. By shifting the contents of the D-Register indirectly through the K$_7$ flip-flop to the M-Register, the contents of the M-Register is shifted 1 bit to the left (multiplied by 2) and the most significant bit is stored in the K$_7$ flip-flop at the end of this micro-operation. This multiplication by 2 converts a word address to a byte address.

$FL = \overline{C_3Q} \cdot \overline{C_2Q} \cdot \overline{K_5Q} \cdot (B11 \cdot Y1 + K_3Q) \cdot W1$ The FL micro-operation occurs in the word time 1 and has a duration of 1 bit time. It sets selected flip-flops to control subsequent micro-operations. The operations executed are:

0→K$_1$ at B0
1→K$_3$ at B0
Y4→K$_4$ at B0

$FM = \overline{C_3Q} \cdot \overline{C_2Q} \cdot \overline{K_5Q} \cdot \overline{K_1Q} \cdot W2$ The FM micro-operation occurs at word time 2 and has a duration of 8 bit times. It is used to access a first of the two bytes for the instructions that use the FK or FL micro-operations. The operations executed are as follows:

Read Strobe at B7
(PM<M>)→I
Restore Strobe at B3

$FN = \overline{C_3Q} \cdot \overline{C_2Q} \cdot \overline{K_5Q} \cdot \overline{K_1Q} \cdot W3$ The FN micro-operation occurs at word time 3 and has a duration of eight bit times. It causes an eight-bit byte accessed from the program memory in the FM micro-operation to be scanned out of the memory data lines (I) into the SPM-2 Register. The operations executed are as follows:

(I)→SPM<2>$_{msh}$ at B7 thru B0
(SPM<2>$_{msh}$)→SPM<2>$_{lsh}$ at B7 thru B0

These steps scan the contents of the I-lines into the most significant half of the SPM-2 Register and the most significant half of the SPM-2 Register into the least significant half of the SPM-2 Register.

$FO = \overline{C_3Q} \cdot \overline{C_2Q} \cdot \overline{K_5Q} \cdot \overline{K_1Q} \cdot W4$ The FO micro-operation occurs in word time 4 and has a duration of 12 bit times. It is used to increment the M-Register to permit the second of the two bytes to be accessed from program memory. This operation can be executed simultaneously with the FN micro operation if a core memory is used, but is performed after the FN micro-operation to permit a ROM to be used in place of a core memory. The operations executed are as follows:

(M)+1→M at B11 thru B0

0→$K_8$ at B0

The M carry flip-flop is used to increment the M-Register and then reset at the end of this micro-operation.

$FP = \overline{C_3Q} \cdot \overline{C_2Q} \cdot \overline{K_5Q} \cdot \overline{K_1Q} \cdot W5$ The FP micro-operation occurs in word time 5 and has a duration of eight bit times. It is used to access the second byte from program memory. The operations executed are as follows:

Read Strobe at B7

(PM<M>)→I

Restore Strobe at B3

This micro-operation transfers the second byte into the memory data lines (I) and then restores the information to the memory.

$FQ = \overline{C_3Q} \cdot \overline{C_2Q} \cdot \overline{K_5Q} \cdot \overline{K_1Q} \cdot W6$ This micro-operation occurs in word time 6 and has a duration of eight bit times. The second byte is scanned out of the I-lines and into the SPM-2 Register. The operations executed are as follows:

(I)→SPM<2>$_{msh}$ at B7 thru B0

(SPM<2>$_{msh}$)→SPM<2>$_{lsh}$ at B7 thru B0

These operations complete the transfer of the two bytes from memory into the SPM-2 Register.

$FR = \overline{C_3Q} \cdot \overline{C_2Q} \cdot \overline{K_5Q} \cdot K_4Q \cdot K_3Q \cdot \overline{K_1Q} \cdot W7$ The FR micro-operation occurs in word time 7 and has a duration of 12 bit times. It is used to set the proper flip-flops to guide the data processor through subsequent micro-operations in executing the instruction. This operation could be executed simultaneously with the FQ micro-operation if a core memory is used, but is performed after the FQ micro-operation to permit a ROM to be used in place of a core memory. The operations executed are as follows:

0,0,1,0→D at B11 thru B0

A binary 2 is shifted into the least significant bit positions of the D-Register to address the SPM-2 Register which contains the two operand bytes being processed.

1→$C_2$ at B0

0,0→$K_2$, $K_1$ at B0

0,0,0→$K_5$, $K_4$, $K_3$ at B0

$FS = \overline{C_3Q} \cdot \overline{C_2Q} \cdot \overline{K_5Q} \cdot K_4Q \cdot K_3Q \cdot \overline{K_1Q} \cdot W7$ The FS micro-operation occurs in word time 7 and has a duration of twelve bit times. It is used to set the proper flip-flop to guide the data processor through subsequent micro-operations in executing the instructions.

0,0,1,0→D at B11 thru B0

A binary 2 is shifted into the least significant bit of the D-Register to address the SPM-2 Registers which store the two operand bytes.

1→$C_2$ at B0

0,0→$K_2$, $K_1$ at B0

0,0,0→$K_5$, $K_4$, $K_3$ at B0

$FT = Y38 \cdot \overline{C_1Q} \cdot C_0Q$

The FT micro-operation occurs in word time 1 and has a duration of 16 bit times. It is used to add the contents of the A-Register to the contents of an SPM-Register addressed by the D-Register which contains an operand and stores the sum in the A-Register. The contents of the SPM-Register are preserved. The executed operations are as follows:

(A)+(SPM<D>)→A at B16 thru B0

(SPM<D>)→SPM<D> at B16 thru B0

(B0·$C_{n+1}$)→K0 at B0

Any overflow from the addition operation is stored in the $K_0$ flip-flop.

0→$K_7$ at B0

The A adder carry flip-flop is used during this micro-operation and reset at B0.

$FU = Y38 \cdot \overline{C_1Q} \cdot C_0Q$

The FU micro-operation occurs at word time 1 and has a duration of 16 bit times. It is used to subtract an operand stored in the SPM-Register from the contents of the A-Register and stores the difference in the A-Register. The contents of the SPM-Register are preserved. Subtraction is implemented by adding the contents of the A-Register to the ones complement of the operand in the SPM-Register and also adding a least significant bit to convert the ones complement to a twos complement number. The executed operations are as follows:

(A)+$\overline{(SPM<D>)}$+(1×2$^{-n}$)→A at B16 thru B0

(B0·$C_{n+1}$)→K0 at B0

Store overflow.

0→$K_7$ at B0

The A adder carry flip-flop is used during this micro-operation and reset upon its completion.

($C_n$+1)→$K_8$ at B0

The final carry term is stored in the carry flip-flop for the M adder $FV = Y38 \cdot C_1Q \cdot \overline{C_0Q}$ The FV micro-operation occurs in word time 1 and has a duration of 16 bit times. It is used for index instructions to transfer the address of the SPM-Register containing the operand from the D-Register to the $K_5$, $K_4$, and $K_3$ flip-flops. This makes the D-Register available for the operand address of the next instruction. The executed micro-operations are as follows:

1→$K_1$ at B0

The $K_1$ flip-flop is one set to identify an index byte. This will insure that the next instruction will be processed through the FB micro operation, which adds the contents of the selected SPM-Register (identified by the contents of the $K_5$, $K_4$, and $K_3$ flip-flops) to the operand address and stores the sum into the D-Register.

($D_2$, $D_1$, $D_0$)→$K_5$, $K_4$, $K_3$ at B0

$FW = Y38 \cdot \overline{C_1Q} \cdot \overline{C_0Q} \cdot K_{11}Q$

The FW micro-operation occurs in word time 1 and has a duration of 16 bit times. It is used to perform the logical AND operation between the contents of the A-Register and an operand stored in an addressed SPM-Register. The executed operations are as follows:

(A)·(SPM<D>)→A at B15 thru B0

(SPM<D>)→SPM<D> at B15 thru B0

$FX = Y38 \cdot \overline{C_1Q} \cdot \overline{C_0Q} \cdot K_{11}Q$

The FX micro-operation occurs in word time 1 and has a duration of 16 bit times. It is used to EXCLUSIVE-OR the contents of the A-Register and an operand stored in an addressed SPM-Register and store the results in the A-Register. The contents of the addressed SPM-Register are preserved.

$(A) \oplus (SPM<D>) \rightarrow A$
$(SPM<D>) \rightarrow SPM<D>$
$FY = \overline{C_3Q} \cdot C_2Q \cdot C_1Q \cdot \overline{C_0Q} \cdot \overline{K_{11}Q} \cdot K_{10}Q \cdot D_0Q \cdot W1$ The FY micro-operation occurs in word time 1 and has a duration of 16 bit times. It is used during transfer type instructions. The next instruction address, contained in the SPM-2 Register, is exchanged with the return address from the M-Register. Thus, the next instruction address for the transfer is placed in the M-Register and the return address is placed in the SPM-2 Register. The executed operations are as follows:

$(SPM<2>)_{lsh} \rightarrow M$ at B15 thru B4
$(M) \rightarrow SPM<2>_{lsb}$ at B15 thru B0
$0 \rightarrow SPM<2>_{msb}$ at B3 thru B4
$FZ = (C_3Q + C_2Q) \cdot W2$ The FZ micro-operation occurs in word time 2 and has a duration of eight bit times. It is used to access the next program instruction from the memory. The executed operations are as follows:

Read Strobe at B7
Restore Strobe at B3
$Op[I] \rightarrow C$ at B0
$C_3Q \cdot L_1Q \cdot \overline{(K_1Q+\text{interrupt})}: 0 \rightarrow K_1$ at B0
$L_1Q + K_1Q \cdot \text{interrupt}: 1 \rightarrow K_1$ at B0
$0 \rightarrow K_2$ at B0
$C_3Q: 0,0,0 \rightarrow K_5, K_4, K_3$ at B0
$I_3, I_2 \rightarrow K_{11}, K_{10}$ at B0
$FAB = C_3Q \cdot \overline{C_2Q} \cdot C_1Q \cdot \overline{C_0Q} \cdot W1$ The FAB micro-operation occurs in word time 1 and has a duration of 16 bit times. The contents of the A-Register are shifted to a selected output channel while the contents of a selected input channel are simultaneously shifted into the A-Register. Executed operations are as follows:

$(A) \rightarrow I/O<D>$ at B15 thru B0
$(I/O<D>) \rightarrow A$ at B15 thru B0
$FAC = C_3Q \cdot \overline{C_2Q} \cdot C_1Q \cdot C_0Q \cdot W1$ The FAC micro-operation occurs at word time 1 and has a duration of 16 bit times. It is used to store the contents of the A-Register in an addressed SPM-Register. The executed operations are as follows:

$(A) \rightarrow SPM<D>$ at B15 thru B0
$(A) \rightarrow A$ at B15 thru B0
The A-Register is recirculated.
$Sn[A] \rightarrow K_1$ at B0

The sign of the operand stored in the A-Register, which is the most significant bit, is placed in the $K_1$ flip-flop but not used.
$FAD = C_3Q \cdot \overline{C_2Q} \cdot C_1Q \cdot C_0Q \cdot \overline{K_{11}Q} \cdot W1$ The FAC micro-operation occurs in word time 1 and has a duration of 16 bit times. It is used for a shift lift operation on the A-Register and is implemented by extending the least significant portion of the A-Register with flip-flops $K_2$, $K_3$, $K_4$ and $K_5$. The A-Register is then shifted right for 16 bit times through these extra four flip-flops. The number of shifts left is selected and implemented by recirculating the output from a selected K flip-flop back to the input of the A-Register. This effectively increases the recirculation path by the required number of bit time delays thereby implementing a left shift after the 16 clock pulses. For instance, if the output of the second flip-flop ($K_3Q$) is selected, the contents will be shifted left two positions, and if the third flip-flop ($K_4$) is selected, the output will be shifted left three positions. For the left shift, the sign bit is shifted into the least significant bit of the A-Register by preloading the $K_2$-$K_5$ flip-flops with the sign bit contained in the $K_1$ flip-flop. The executed operations are as follows:

$(K_1Q) \rightarrow A$ at B15
$(A_i) \rightarrow A_i - 1$ at B15 thru B0
$(A_0Q) \rightarrow K_2$ at B15 thru B0
$(K_2Q) \rightarrow K_3$ at B15 thru B0
$(K_3Q) \rightarrow K_4$ at B15 thru B0
$(K_4Q) \rightarrow K_5$ at B15 thru B0
$\overline{D_1Q}, \overline{D_0Q}: (K_2Q) \rightarrow A$ at B15 thru B0
$\overline{D_1Q}, D_0Q: (K_3Q) \rightarrow A$ at B15 thru B0
$D_1Q, \overline{D_0Q}: (K_4Q) \rightarrow A$ at B15 thru B0
$D_1Q, D_0Q: (K_5Q) \rightarrow A$ at B15 thru B0
$FAE = C_3Q \cdot \overline{C_2Q} \cdot \overline{C_1Q} \cdot C_0Q \cdot K_{11}Q \cdot \overline{K_{10}Q} \cdot W1$ The FAE micro-operation occurs in word time 1 and has a variable duration ranging from 1 to 16 bit times. It is used for a right shift and is implemented by preloading the bit counter with the contents of the D-Register. The bit counter 1 then clocks the A-Register for the selected number of shifts. For the right shift, the sign bit is shifted into the most significant portion of the accumulator. Executed operations are as follows:

$(A_i) \rightarrow A_i - 1$ at $B<D_3, D_2, D_1, D_0>$ thru B0
$(K_1) \rightarrow A_{15}$ at $B>D_3, D_2, D_1, D_0>$ thru B0
The sign bit is loaded into the A-Resgister.
$FAF = C_3Q \cdot \overline{C_2Q} \cdot \overline{C_1Q} \cdot C_0Q \cdot K_{11}Q \cdot K_{10}Q \cdot W1$ The FAF micro-operation occurs in word time 1 and has a variable duration from 1 to 16 bit times. It is used for end around shift. The D-Register is used to set the bit timer to the selected number of end around shifts. The bit timer then clocks the A-Register as it counts down. The executed operations are as follows:

$(A_i) \rightarrow A_i - 1$ at $B<D_3, D_2, D_1, D_0>$ thru B0
$(A_0) \rightarrow A$ at $B<D_3, D_2, D_1, D_0>$ thru B0
$FAG = C_3Q \cdot C_2Q \cdot \overline{C_1Q} \cdot WW1$ The FAG micro-operation occurs in word time 1 and has a duration of 12 bit times. It is used for the skip on discrete instruction. If the selected discrete is true, the M-Register is clocked and incremented by three. If the selected discrete is false, the M-Register is not clocked and is therefore not incremented. The executed operations are as follows:

$DSI<D>: (M)+3 \rightarrow M$ at B11 thru B0
$0 \rightarrow K_8$ at B0
The M carry flip-flop is used to increment the M-Register and reset at the end of the micro-operation.
$FAH = C_3Q \cdot C_2Q \cdot \overline{C_1Q} \cdot W1$ The FAH micro-operation occurs in word time 1 and has a duration of 12 bit times. It is used to implement the discrete output instruction. The operation executed is as follows:

$1 \rightarrow DSO<D> B11$ thru B0
$FAI = \overline{C_3Q} \cdot \overline{C_2Q} \cdot K_2Q \cdot \overline{K_1Q} \cdot WI$ The FAI micro-operation occurs in word time 1 and has a duration of 12 bit times. It is used during the decrement and transfer instruction when the contents of a selected index register has been decremented to a negative number. It should be noted that an alternate path is taken when the contents of the selected index register remain positive. This alternate path is through the FL micro-operation as with other transfer type instructions. The executed operations are as follows:

$(M)+2 \rightarrow M$ at B11 thru B0
$1 \rightarrow C_2$ at B0
$0 \rightarrow K_8$ at B0

The M-carry register is used to increment the M-Register and reset to zero at the end of the micro-operation.

$FAJ = L_1Q \cdot W3$

The FAJ micro-operation occurs in word time 3 and has a duration of 16 bit times. It is entered for a turn-on interrupt (identified by the $L_1Q$ signal) and is, effectively, a no operation. The operations executed are:

$0 \rightarrow L_1$ at B0

$FAK = \overline{L_1Q} \cdot \overline{P89} \cdot Y7 \cdot W3$

The FAK micro-operation occurs in word time 3 and has a duration of 16 bit times. It is used for external interrupts and is entered if there is an external interrupt, $\overline{P89}$, and there is no interrupt disable, $L_3Q$, or there is a preceding index instruction identified by $K_1Q$. It acts as a spacer for the word counter and no operations take place.

$FAL = K_1Q \cdot W4$

The FAL micro-operation occurs in word time 4 and has a duration of 16 bit times. It is used for the start of the interrupt routine, preloading the M-Register with memory address $040_{16}$ and storing the return address in the SPM-2 Register. Operations executed are as follows:

$040_{16} \rightarrow M$ at B15 thru B0
$(M) \rightarrow SPM<2>_{1sb}$ at B15 thru B0
$FAM = K_1Q \cdot W5$ The FAM micro-operation occurs in word time 5 and has a duration of eight bit times. It is used to access the contents of the program memory portion of the memory at location $040_{16}$, which is the start of the interrupt routine. Operations executed are as follows:

Read Strobe at B7
Restore Strobe at B3
$(PM<M=64>) \rightarrow I$ at B7
$Op[I] \rightarrow C_3, C_2, C_1, C_0, K_{11}, K_{10}$ at B0
$0 \rightarrow L_3$ at B0

The interrupt disable flip flop is cleared.

$FAN = K_1Q \cdot W6$

FAN is a no-op.

$FAO = K_1Q \cdot W7$

The FAO micro-operation occurs in word time 7 and has a duration of 12 bit times. It is effectively a no op, merely setting the control flip-flops for a new word time cycle. Operations executed are:

$0 \rightarrow W_2, W_1, W_0$ at B0 The word counter is reset.
$0 \rightarrow K_5, K_4, K_3, K_2, K_1$, at B0
$FAP = \overline{C_3Q} \cdot C_2Q \cdot Y6 \cdot \overline{K_{10}Q} \cdot W1$ The FAP is a no-op.

$FAQ = C_1Q \cdot C_0Q \cdot Y39$

The FAQ micro-operation occurs in word time 1 and has a duration of 16 bit times. The contents of the selected SPM Register is preserved by recirculation and also transfer to the A Register.

$(SPM<D>) \rightarrow SPM$ D at B15 thru B0
$(SPM<D>) \rightarrow A$ at B15 thru B0

Initialization

During initialization of the data processor 12, the following operations are executed:

1. $L_1$ is in the true state due to the power turn-on condition.
2. FAJ is always automatically entered for start-up to initialize the following functions:
   A. The M-Register is preset to the PM address $040_{16}$ in FAL.
   B. All SPM Registers are cleared under program control.
   C. The D-Register is loaded from $PM<M> = 040_{16}$.
   D. The C-Register $(C_3, C_2, C_1, C_0, K_{11}, K_{10})$ is loaded from $PM<M> = 040$.
   E. The PM Read and Restore Strobes are generated in FAM.
   F. The A-Register is cleared under program control.
   G. The $K_1$ flip-flop is cleared in FAO.
   H. The $K_2$ flip-flop is cleared in FAO.
   I. Flip-flops $K_5, K_4, K_3$ are cleared in FAO.
   J. Flip-flops $K_8, K_7$, the M-Register and A-Register carry flip-flops are reset at every B0.

Discrete Outputs

The data processor 12 can generate discrete outputs (DO) to meet specific requirements under program control. The DO assignments are:

DO-0: Set interrupt enable.
DO-1: Provide clock pulses to ASR-33 (TELETYPEWRITER).
DO-2: Provides a clock to set the power turn-on interrupt, $L_1$. A DO-2 instruction (1100-0010) will be contained in program memory location $40_{16}$ to reset $L_1$ during power turn-on.
DO-3: Iteration timer reset.
DO-4: Trigger to $I_2$ latch, the discrete input 4(DI-4) toggle. The $I_2$ flip-flop is automatically zero set during the power on sequence.
DO-5: Trigger to $I_3$ latch, the discrete input-5(DI-5) toggle. The $I_3$ flip-flop is automatically zero set during the power turn-on sequence.
DO-6: Trigger to the $I_4$ latch, the discrete input-6 (DI-6) toggle. The $I_4$ flip-flop is automatically zero set during the power turn-on sequence.
DO-7: Intensity control.
DO-8: Toggles the $I_1$ flip-flop causing scratch pad memory paging.
DO-9: Main memory paging.
DO-10: Spare.
DO-11: Servo set.

Discrete Inputs

The data processor 12 can operate on a discrete input (DI) with a skip-on-discrete instruction under program control. The discrete inputs are various low frequency digital signals. The purpose of the discrete inputs is to define a status or condition. The DI assignments are:

DI-0: Spare.
DI-1: Skip unconditional.
DI-2: Skip on ASR-33 (TELETYPEWRITER).
DI-3: Skip on the sign of (A).
DI-4: Skip on $I_2Q$ latch (DO-4 trigger).
DI-5: Skip on $I_3Q$ latch (DO-5 trigger).
DI-6: Skip on $I_4Q$ latch (DO-6 trigger).
DI-7: Skip on logical overflow in A-Register.
DI-8: Used for troubleshooting.
DI-9: Skip on arithmetic carry from A-Register.
DI-10: Skip on positive.
DI-11: Skip on servo ready.

Interrupts

Interrupts may be added virtually without limit. All interrupts are logically ORed together (X5) to transfer operation of the data processor 12 to an interrupt subroutine starting in memory location $040_{16}$. The return address is preserved in SPM-2. The interrupt subroutine will scan the discrete interrupt inputs and operate on each interrupt.

The interrupt enable flip-flop ($L_3$) will automatically disable interrupts within interrupts, but may be set with a DO-0 after the return address in SPM-2 has been stored elsewhere under program control, thereby permitting interrupts within interrupts. The end of the interrupt subroutine requires the transfer to the return address, the setting of the interrupt enable flip-flop ($L_3$) if required, and the transfer indirect (TI) to the return address contained in SPM-2.

The interrupt enable flip-flop ($L_3$) may be used to preserve the contents of SPM-2 against the contingency of an interrupt to permit time shared use of SPM-2.

Data-Save

The power supply generates a C signal which indicates the power supply is out of tolerance limits and requests the data processor 12 to generate a data-save signal in the event of a power dropout. Following a delay of sufficient duration to insure the completion of a memory cycle, the data processor generates a data-save signal $(\overline{L_2Q})$ in response to the C signal generated by the power supply. The delay will range from 20 nanoseconds to 35 microseconds and will have an average duration of 7 microseconds. The data-save operation constitutes the power turn-off interrupt, where the C signal will always initiate a data-save function which will terminate normal computer operation.

Adaptive Memory Control

The data processor 12 incorporates an adaptive memory control that adds additional memory protection to insure that the power turn-on condition does not cause detrimental system operation and provide protection from loss of program. In the data processor, this power condition is detected and used to initiate a power interrupt ($L_1Q$); which forces the data processor to look at a specific memory address (040 HEXADECIMAL) by preloading this address into the M-Register. The data processor will continue to access this address until the power interrupt condition is alleviated. In prior art systems, the power interrupt is eliminated when the voltages come within tolerance. In this invention, adaptive techniques are used that insures that not only are the voltages back into tolerance levels, but memory can be properly accessed. This technique is implemented with a memory access interlock implemented by requiring that an instruciton that generates a discrete output (DO-2) be located in the first location of the power interrupt program in memory ($040_{16}$). This discrete output (DO-2) instruction provides the adaptive interlock to insure that memory cannot be accessed before the power interrupt is exited.

Memory Protect

A memory protect scheme greatly reduces problems with loss of program and protects against the program wiping out part of the program. This is accomplished by logically processing the memory address register outputs to produce a signal P110 (Table II) disabling the write mode (associated with the memory read-write logic) when the M-Register is addressing protected parts of the memory. This technique effectively permits an electrically alterable (core type) memory to be configured as a read-only memory in selected locations for additional protection of the program stored in that memory.

Instruction Repertoire

The program instructions for the numerical control system 10 are encoded as 8-bit bytes, each byte being stored in a different program memory location of the program memory. The instructions may have multiple bytes, but most have a length of only 1 byte. Each instruction contains an operation code in the most significant portion, and, when required, an operand address in the least significant portion. Indexing is achieved with an index functional modifier byte preceding the instruction whose operand address is to be indexed. Operands can be located in any of the SPM Registers, the constant memory part of the program memory, or in the two program memory bytes following an instruction (n line).

Functional Modifier

The program instructions follow a functional modifier concept which yields a high degree of flexibility and economy. This concept permits conservation of memory by the use of short instructions without sacrifice of flexibility or capability. As an example, extensive indexing capability is available when required even though an index field is not required in an instruction. This indexing capability is implemented by programming an index functional modifier prior to an instruction to be indexed. This functional modifier indicates that the following instruction is to be indexed and identifies the location of the index. A functional modifier may also be used to make available double precision shifting capability. The short instruction word length which is configured for efficient use of memory permits only enough instructions for single precision shifting operations. A double precision shift capability is implemented by preceding the shift instructions with a functional modifier to indicate that the subsequent shift instruction is a double precision shift. Thus, both single and double precision shifting capability may be implemented without use of excessively long instruction words.

DETAILED DESCRIPTION OF INSTRUCTIONS

For convenience of discussion, the instructions are divided into four categories A, B, C, and D. During the execution of Group A instructions, operands are obtained from the constant memory portion of the main memory with SPM-2 used as an intermediate working register. Therefore, SPM-2 contents must be expendable when using Group A instructions. The operand address pertains to the corresponding locations in the constant memory portion of the main memory, and are defined as double byte locations 0 through 15, but are indexable through many additional pages of double byte locations. Double byte operands are used because two 8-bit bytes are used for each 16 bit operand, each memory location storing one byte. Therefore operand word address 0 defines memory byte address locations 0 and 1, operand word address 1 defines memory byte address locations 2 and 3. Thus, twice the operand word address defines the first of the two operand byte address locations. Certain operand addresses pertain to the two bytes following the instruction. Constants and parameters can be stored in the main memory with the least significant half (lsh) of the word in the first byte and the most significant half (msh) of a word in the second byte. The constant memory portion of the main memory is composed of many 16 word pages where each word is composed of two 8-bit bytes. The Group A instructions can be indexed to select required constants or parameters.

The Group A instructions are as follows:

1. LS (load SPM-2 with next two bytes) 0010-0001.

This is a three-byte instruction having the above operation code contained in the zero byte. It causes the subsequent byte 1 and byte 2 containing the least significant half and most significant half, respectively, of an in-line operand to be loaded into SPM-2. This instruction is not indexable, it uses micro-operations FA, FL, FM, FN, FO, FP, FQ, FJ, FAP, and FZ.

2. ST (store (A) in PM) 0010-0101.

This is a one byte instruction having the above operation code. It causes a two-byte operand previously stored in the A-Register to be stored in a main memory location whose address is stored in the 12 least significant bits of the SPM-2 register. The first byte (lsh) of the operand is loaded into the memory location addressed by SPM-2 and the second byte (msh) of the operand is loaded into the memory location following the first byte. The operand is also preserved in A. The operand address is incremented twice, identifying the memory location following the second byte, and returned to SPM-2 where it is preserved. This permits a second operand to be loaded into the A-Register and then transferred to the next-in-line memory location with a second ST instruction. The next instruction address is also preserved and can be used to access the next instruction. The micro-operations used during this instruction are FA, FD, FE, FG, FF, FH, FI, FJ, FY, and FZ.

3. TX (decrement and transfer on non-negative) 0010-0110.

This may be either a three or a four-byte instruction. The first byte is an optional index byte and defines an index register. The absence of an index byte defines the SPM-0 Register. The second byte contains the above operation code and the third and fourth bytes define a transfer address. A non-negative decremented number will cause the next instruction to be accessed from the transfer address location defined by the last two bytes of this instruction. The return address is stored in the SPM-2 Register.

A negative decremented number will cause the next instruction to be accessed from the byte following the last byte (address byte 2). The transfer address (which is not used) is preserved in SPM-2.

This instruction is used to guide the data processor through a loop one or more times. The desired number of transfers, less one, is initially loaded into the appropriate index register. This number will then be decremented through zero to a negative number before the loop is exited.

As long as the decremented number is non-negative, the TX instruction goes through micro-operations FC, FL, FM, FN, FO, FP, FQ, FJ, FY and FZ.

As soon as the decremented number becomes negative, the TX instruction goes through micro-operations FC, FAI, and FZ.

4. TR (unconditional transfer) 0010-0111.

This is a three-byte instruction in which the above operation code is contained in the first byte and a transfer address defined by the second and third bytes. This instruction will cause the next instruction to be accessed from the transfer address location defined by the second and third bytes. The return address is preserved in SPM-2. This instruction goes through micro-operations FA, FL, FM, FN, FO, FP, FQ, FJ, FY and FZ.

5. IP (index) 0010-1$I_2I_1I_0$

This is a one-byte indexable functional modifier containing the operation code in the five most significant bits and an operand address in the three least significant bits. A first index (IP or IS) instruction preceding a second index (IP or IS) instruction will cause the operand address of the second index (IP or IS) instruction to be indexed by the operand of the first index (IP or IS). Thus, multilevel indexing is permissible without limit and index parameters can be obtained from locations throughout the memory.

This instruction goes through micro-operations FA, FK, FM, FN, FO, FP, FQ, FR, FV, and FZ.

6. IP-7 (index) 0010-1111

When an index instruction identifies address location 111 it becomes a three-byte non-indexable instruction wherein an operand is contained in the second and third bytes. The operand is transferred to the SPM-2 Register. This instruction goes through micro-operations FA, FL, FM, FN, FO, FP, FQ, FS, FV and FZ.

7. DP (Add) 0001-$I_3I_2I_1I_0$

This is a one-byte indexable instruction wherein the operation code is stored in the first four bits and an operand address is stored in the last four bits. This instruction causes the contents of an SPM-Register identified by the address portion to be added to the contents of the A-Register and the results stored in the A-Register. This instruction goes through micro-operations FA, FK, FM, FN, FO, FP, FQ, FR, FT and FZ.

8. DP-15 (Add) 0001-1111

When a DP instruction identifies address location 1111 it becomes a three-byte non-indexable instruction with the second and third bytes containing an operand. This operand is added to the contents of the A-Register and the results stored in the A-Register. This instruction goes through micro-operations FA, FL, FM, FN, FO, FP, FQ, FS, FT, and FZ.

9. BP (subtract ) 0011-$I_3I_2I_1I_0$

This is a one-byte indexable instruction wherein the operation code is contained within the first four bits and an operand address is identified by the second four bits. It causes an operand stored in an SPM-Register defined by the operand address to be subtracted from the contents of the A-Register and the results stored in the A-Register. This instruction goes through micro-operations FA, FK, FM, FN, FO, FP, FQ, FR, FU, and FZ.

10. BP-15 (subtract) 0011-1111

When the operand address defined by a BP instruction is 1111 it becomes a three-byte non-indexable instruction. The second and third bytes contain an operand which is subtracted from the contents of the A-Register and the difference stored in the A-Register. This instruction goes through micro-operations FA, FL, FM, FN, FO, FP, FQ, FS, FU and FZ.

11. XP (exclusive-OR) 0000-0$I_2I_1I_0$

This is a one-byte indexable instruction in which the operation code is contained in the five most significant bits and an SPM-Register containing an operand is defined by the three least significant bits. The operand is exclusive-ORed with the contents of the A-Register and the result is stored in the A-Register. This instruction goes through micro-operations FA, FK, FM, FN, FO, FP, FQ, FR, FX and FZ.

12. XP-7 (exclusive-OR) 0000-0111

When an XP instruction defines operand address 111, it becomes a three-byte non-indexable instruction containing an operand in the second and third bytes. This operand is exclusive-ORed with the contents of the A-Register and the result is stored in the A-Register. This instruction goes through micro-operations FA, FL, FM, FN, FO, FP, FQ, FR, FX and FZ.

13. AP (logical AND) 0000-1$I_2I_1I_0$

This is a one-byte indexable instruction wherein the operation code is contained in the five most significant bits and an SPM-Register address containing an operand is defined by the three least significant bits. The operand contained in the addressed SPM-Register is logical ANDed with the contents of the A-Register and the result is stored in the A-Register. A logical AND with a 0 operand is used to clear the A-Register. This instruciton goes through micro-operations FA, FK, FM, FN, FO, FP, FQ, FR, FW, and FZ.

14. AP-7 (logical AND) 0000-1111

When the address defined by an AP instruction is 111, it becomes a three-byte non-indexable instruction having an operand contained in the second and third bytes. The operand is logical ANDed with the contents of the A-Register and the result is stored in the A-Register. This instruction goes through micro-operations FA, FL, FM, FN, FO, FP, FQ, FS, FW and FZ.

Group B instructions obtain all operands from the scratch pad memory. Each SPM page consists of 16 registers with indexing permitted between the two SPM pages. Caution is required when using SPM-2 because an inerrupt will replace the contents of SPM-2 with a return address. This can be circumvented with the use of an interrupt disable discrete. In addition, the use of a Group A instruction will replace the contents of the SPM-2 Register with either data or a return address, requiring the transfer of SPM-2 data to another SPM-Register before a Group A instruction is used if the data is to be preserved.

15. TI (transfer indirect) 0110-0111

This is a one-byte non-indexable instruction having the above operation code. It causes the address of the next instruction to be obtained from SPM-2 and the return address stored in SPM-2. It goes through micro-operations FA, FY and FZ.

16. IS (index) 0110-1$I_2I_1I_0$

This is a one-byte indexable functional modifier having the operation code contained in the five most significant bits and an address defining an SPM-Register containing an operand contained in the three least significant bits. A first index (IP or IS) instruction following a second index (IP or IS) instruction will cause the operand address of the second index (IP or IS) instruction to be indexed by the operand of the first index (IP or IS) instruction. Multilevel indexing is thus permissible without limit. Only SPM-Registers 0 through 7 of each SPM page may be used as index registers. This is a single byte functional modifier programmed immediately prior to an instruction to be indexed. This instruction goes through micro-operations FA, FV and FZ.

17. DS (Add) 0101-$I_3I_2I_1I_0$

This is a one-byte indexable instruction wherein the four most significant bits define the operation code and the four least significant bits define an SPM-Register address containing an operand. The operand in the addressed SPM-Register is added to the contents of the A-Register and the sum is stored in the A-Register. This instruction goes through micro-operations FA, FT and FZ.

18. BS (subtract) 0111-$I_3I_2I_1I_0$

This is a one-byte indexable instruction wherein the four most significant bits define the operation code and the four least significant bits define a scratch pad memory address containing an operand. The addressed operand is subtracted from the contents of the A-Register and the difference is stored in the A-Register. This instruction goes through micro-operations FA, FU and FZ.

19. XS (exclusive-OR) 0100-0$I_2I_1I_0$

This is a one-byte indexable instruction wherein the five most significant bits define the operation code and the three least significant bits define an SPM address containing an operand. The operand is exclusive-ORed with the contents of the A-Register and the result is stored in the A-Register. This instruction goes through micro-operations FA, FX and FZ.

20. AS (logical AND) 0100-1$I_2I_1I_0$

This is a one-byte indexable instruction wherein the five most significant bits define the operation code and the three least significant bits define an SPM address containing an operand. The addressed operand is logical ANDed with the contents of the A-Register and the result is stored in the A-Register. This instruction goes through micro-operations FA, FW and FZ.

The following Group C type instructions relate to operations generally involving the A-Register.

21. SS (store (A) in SPM) 1000-$I_3I_2I_1I_0$

This is a one-byte indexable instruction wherein the four most significant bits identify the operation code and the four least significant bits define an SPM address. The contents of the A-Register are placed in the addressed SPM-Register and also preserved in the A-Register. This instruction uses micro-operations FA, FAC and FZ.

22. SL (shift left) 1001-00$I_1I_0$

This is a one-byte non-indexable instruction wherein the six most significant bits define the operation code and the two least significant bits define the number of shifts. The contents of the A-Register are shifted left by the binary number defined by $(I_1I_0)+1$. In other words, $\overline{I_1}, \overline{I_0}=1$ shift, $\overline{I_1}I_0=2$ shifts, $I_1\overline{I_0}=3$ shifts, and $I_1I_0=4$ shifts. 0's are shifted into the vacated least significant bits of the A-Register. This instruction goes through micro-operations FA, FAD and FZ.

23. SE (shift end around) 1001-11$I_1I_0$

This is a one-byte indexable instruction wherein the six most significant bits identify the operation code and the two least significant bits identify a number of shifts. The number of bits shifted can be indexed up to a maximum of 16 bits. The contents of the A-Register are shifted by the binary number represented by $(I_1I_0)+1$. That is, $\overline{I_1},\overline{I_0}=1$ shift, $\overline{I_1}I_0=2$ shifts, $I_1\overline{I_0}=3$ shifts, and $I_1I_0=4$ shifts. Additional shifts are accomplished by indexing. The end around shift is effectively a right shift where the least significant bit is shifted out of the A-Register and recirculated into the most significant bit position of the A-Register. This instruction goes through micro-operations FA, FAF and FZ.

24. SR (shift right) 1001-10$I_1I_0$

This is a one-byte indexable instruction wherein the six most significant bits identify the operation code and the two least significant bits identify a number of shifts. The number of bits shifted can be indexed up to a maximum of 16 bits. The contents of the A-Register are shifted right as indexed or by a number of bits equal to the binary number defined by $(I_1I_0)+1$. That is, $I_1$, $I_0=1$ shift, $I_1I_0=2$ shifts, $I_1I_0=3$ shifts, and $I_1I_0=4$ shifts. The sign bit of the A-Register is continuously shifted into the most significant bit position. This instruction goes through micro-operations FA, FAE and FZ.

25. EX (input/output word) 1010-$I_3I_2I_1I_0$

This is a one-byte indexable instruction wherein the four most significant bits identify the operation code and the four least significant bits identify and X/0 channel address. The contents of the A-Register are output to the addressed channel while the contents of the addressed channel are simultaneously loaded into the A-Register. A shift enable signal is output to gate 16 clock pulses to the selected channel. This instruction goes through micro-operations FA, FAB, and FZ.

26. EX-15 (input/output word) 1010-1111

This instruction clears the A-Register by shifting in the contents of a non-existent input channel which are all zeros. This instruction goes through micro-operations FA, FAB and FZ.

27. LD (load accumulator) 1011-$I_3I_2I_1I_0$

This is a one-byte indexable instruction wherein the four most significant bits identify the operation code and the four least significant bits identify an SPM address containing an operand. The operand in the addressed SPM-Register is loaded into the A-Register. This instruction goes through micro-operations FA, FAQ and FZ. Group D instructions relate to the discretes.

28. DC (discrete output) 110$I_4$-$I_3I_2I_1I_0$

This is a one-byte indexable instruction wherein the three most significant bits define the operation code and the five least significant bits define an output channel address. A discrete output signal, an inverted 3 microsecond pulse is generated on the addressed output channel. This instruction goes through micro-operations FA, FH and FZ.

29. SK (skip on discrete) 111$I_4$-$I_3I_2I_1I_0$

This is a one-byte indexable instruction wherein the three most significant bits identify the operation code and the five least significant bits identify a discrete input channel address. If a discrete exists on the addressed channel, three bytes (usually a transfer instruction) are skipped and the next instruction is obtained from the fourth byte following the skip on discrete instruction. If a discrete does not exist on the addressed channel, the next instruction (usually a three-byte transfer instruction) is obtained from the three bytes immediately following the skip on discrete instruction. This instruction goes through micro-operations FA, FAG and FZ.

Two rules create exceptions to the above micro operation flow paths.

1. When an interrupt occurs during the execution of an instruction, the instruction will not terminate with the FZ micro-operation but instead will continue through the FAK, FAL, FAM, FAN, FAO micro-operations.

2. Whenever an instruction normally going through the FA micro-operation is preceded by an index functional modifier (IS or IP) it will go through FB in lieu of FA.

SCHEMATIC DIAGRAMS

As previously noted the data processor is physically layed out on a series of printed circuit boards interconnected by a Mother board. The schematic diagrams in FIGS. 6–17 show columns of numbers and letters representing plug interconnections and common signal connections, which are summarized in Table IV. The registers and logic gates are implemented with SN 7400 series integrated circuits. The registers and flip flops are shown in detail in FIGS. 6–17 and the various logical equations such as the inputs to these elements are defined in Table I and Table II. Although the illustrated registers and flip flops, combined with the equations in Table I, Table II, and Table III are sufficient to completely define the operation of the data processor 12 (FIG. 1), groups of logical functions have been shown on the printed circuit boards on which they are actually implemented. It should be understood, however, that the location of gates developing logical signals is largely determined by availability of space and primary or intermediary subsignals and may or may not be related to the ultimate use of a particular logical signal.

The numerous computer signals are defined with both, letters and numbers. The signal definitions in FIGS. 6 thru 17 correspond with the signal definitions in the logical equations and with the microoperation designations. Each logic card shown in FIGS. 6 thru 17 have pin designations that correspond to the signals on that logic card, with those pin designations repeated for each card. The signals for each logic card and the pin designations that corresponds to that signal on that card are shown in Table IV. The pin designations are listed in the left hand column, while the signals corresponding to those pin designations are listed in columns under the card designations (such as cards A, B, C, etc) and the Figure references (such as FIGS. 6, 7, 8, etc).

As shown in FIG. 6 the A-Logic printed circuit board includes the A-Register 130, its associated full adder 132 and the A carry flip-flop $K_7$ 138. Also shown is the M-Register 112, its associated full adder 139, and the carry Flip-flop 140. The A-Register overflow detector flip-flop $OF_1$ 134 and logic gates 135 are also located on the A-Logic board.

As shown in FIG. 7 the B-Logic printed circuit board includes the bit counter, flip-flop $B_0$ 150, $B_1$ 152, $B_2$ 154 and $B_3$ 156. Flip-flops $B_4$ 158, $B_5$ 160, $B_6$ 162 and $B_7$ 164 produce the asymmetric main clock signal P3. Also included on this board is the bit time decode logic 166, logic gates 468 and various other logic gates.

As shown in FIG. 8 the C-Logic printed circuit borad includes various logic gates 17 as well as the C-Register which includes flip-flops $C_3$ 172, $C_2$ 174, $C_1$ 176, $C_0$ 178, $K_{11}$ 180 and $K_{10}$ 182.

Figure 9:
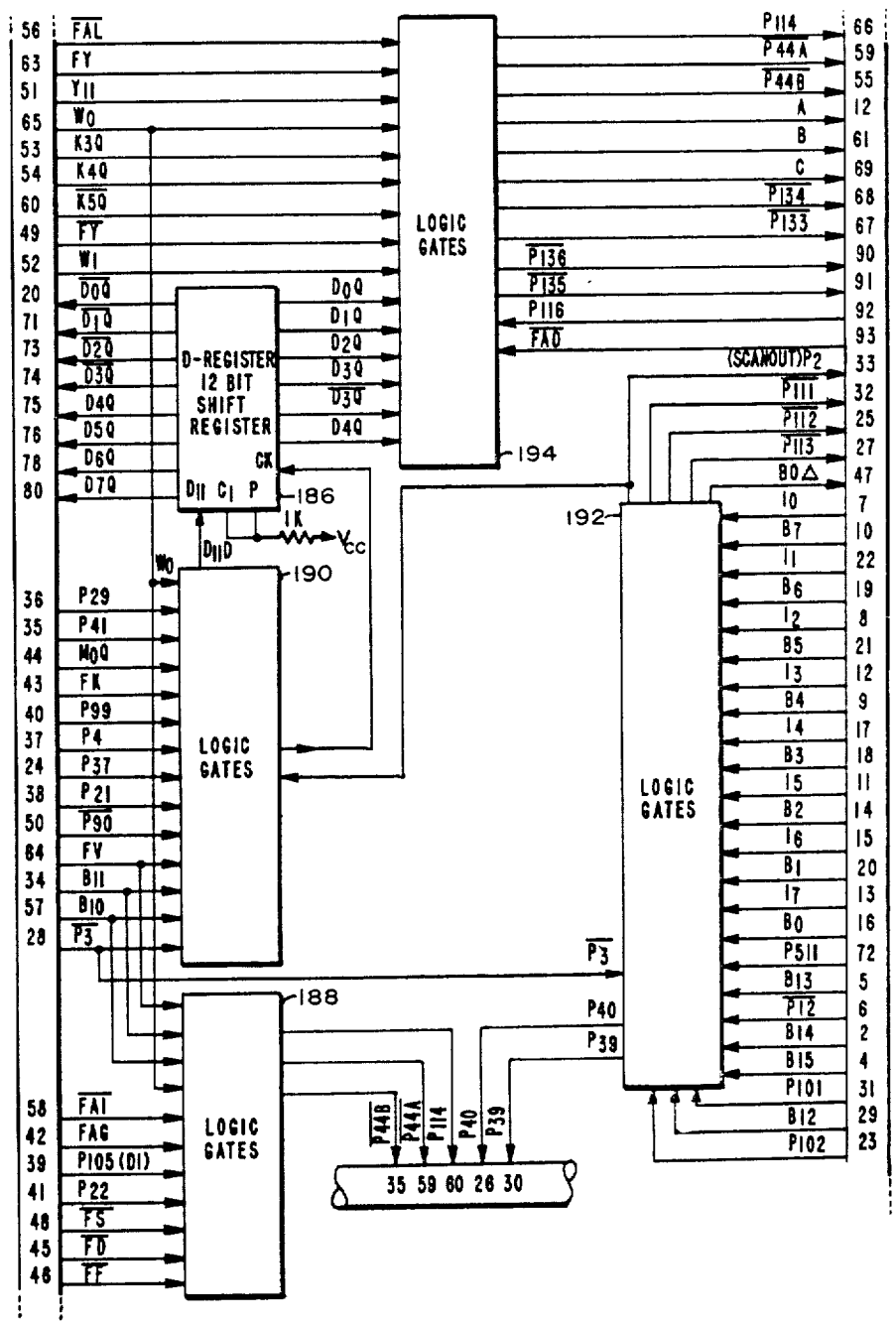
FIG. 9 is a schematic and block diagram representation of the data processor D logic.

As shown in FIG. 9 the D-logic printed circuit board includes the D-Register 186 as well as various logic gates 188, 190, 192 and 194.

Figure 10:
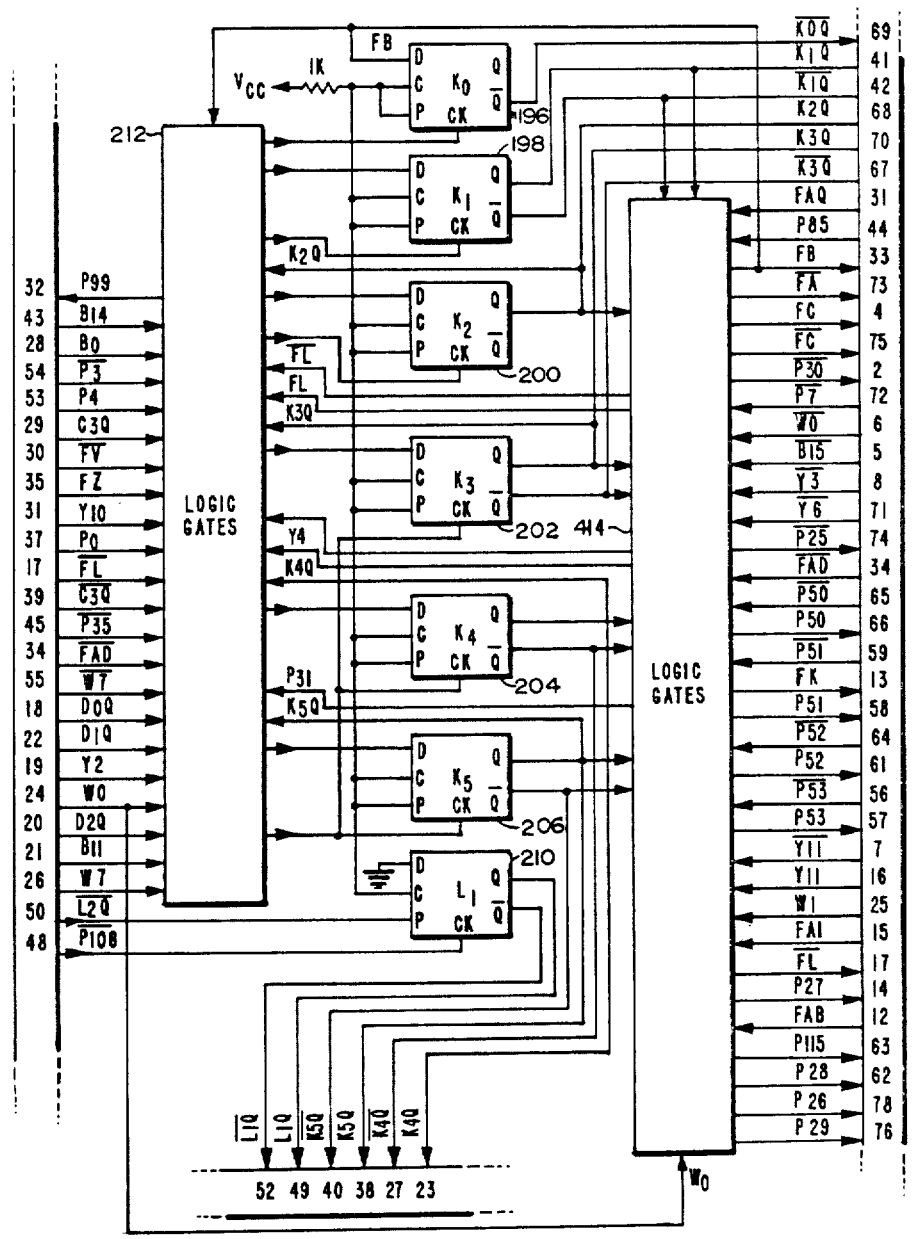
FIG. 10 is a schematic and block diagram representation of the data processor K logic.

As shown in FIG. 10 the K-Logic printed circuit board includes flip-flops $K_0$ 196, $K_1$ 198, $K_2$ 200, $K_3$ 202, $K_4$ 204, $K_5$ 206, and $L_1$ 210. Also included are various logic gates 212 and 414.

As shown in FIG. 11 the W-Logic printed circuit board includes the word counter composed of flip-flops $W_2$ 220, $W_1$ 222 and $W_0$ 224 as well as the flip-flop $L_2$ 226. Also included are various logic gates 228, 230 and 232.

As shown in FIG. 12 an A section Scratch Pad Memory printed circuit board includes eight pairs of integrated circuit shift registers 234. A binary coded decimal to decimal decoder 436 generates memory select signals $\overline{P50}$ through $\overline{P57}$ which is gated through a first series of gates 437. This first gated signal in turn gates a clock signal $\overline{P3A}$ through a second series of gates 441 to clock a selected one of the registers. The outputs from the registers 234 are multiplexed into signals $\overline{P120A}$ and $\overline{P121A}$, each carrying outputs from four of the registers. Three additional scratch pad memory sections B, C and D, identical with A shown in FIG. 12 provide corresponding output signals $\overline{P120B}$, $\overline{121B}$, $\overline{120C}$, $\overline{121C}$, $\overline{120D}$ and $\overline{121D}$. These in turn are multiplexed by NAND gate 443 into a single output signal P85. The signals in the B, C and D sections correspond to those of the A section and are defined according to terminal numbers as follows:

| Terminal No. | A | B | C | D |
|---|---|---|---|---|
| 30 | P48 | P48 | P48 | P48 |
| 32 | P50 | P58 | P66 | P74 |
| 34 | P51 | P59 | P67 | P75 |
| 36 | P52 | P60 | P68 | P76 |
| 38 | P53 | P61 | P69 | P77 |
| 40 | P54 | P62 | P70 | P78 |
| 42 | P55 | P63 | P71 | P79 |
| 44 | P56 | P64 | P72 | P80 |
| 46 | P57 | P65 | P73 | P81 |
| 48 | P133 | P134 | P135 | P136 |
| 50 | C | C | C | C |
| 52 | B | B | B | B |
| 54 | A | A | A | A |
| 56 | P3A | P3B | P3C | P3D |
| 58 | P47 | P47 | P47 | P47 |
| 60 | P121A | P121B | P121C | P121D |
| 62 | P121C | | | |
| 64 | P85 | | | |
| 66 | P120A | P120B | P120C | P120D |
| 68 | P120D | | | |
| 70 | P120C | | | |
| 72 | P121B | | | |
| 74 | P120B | | | |
| 76 | P121D | | | |

Figure 13:
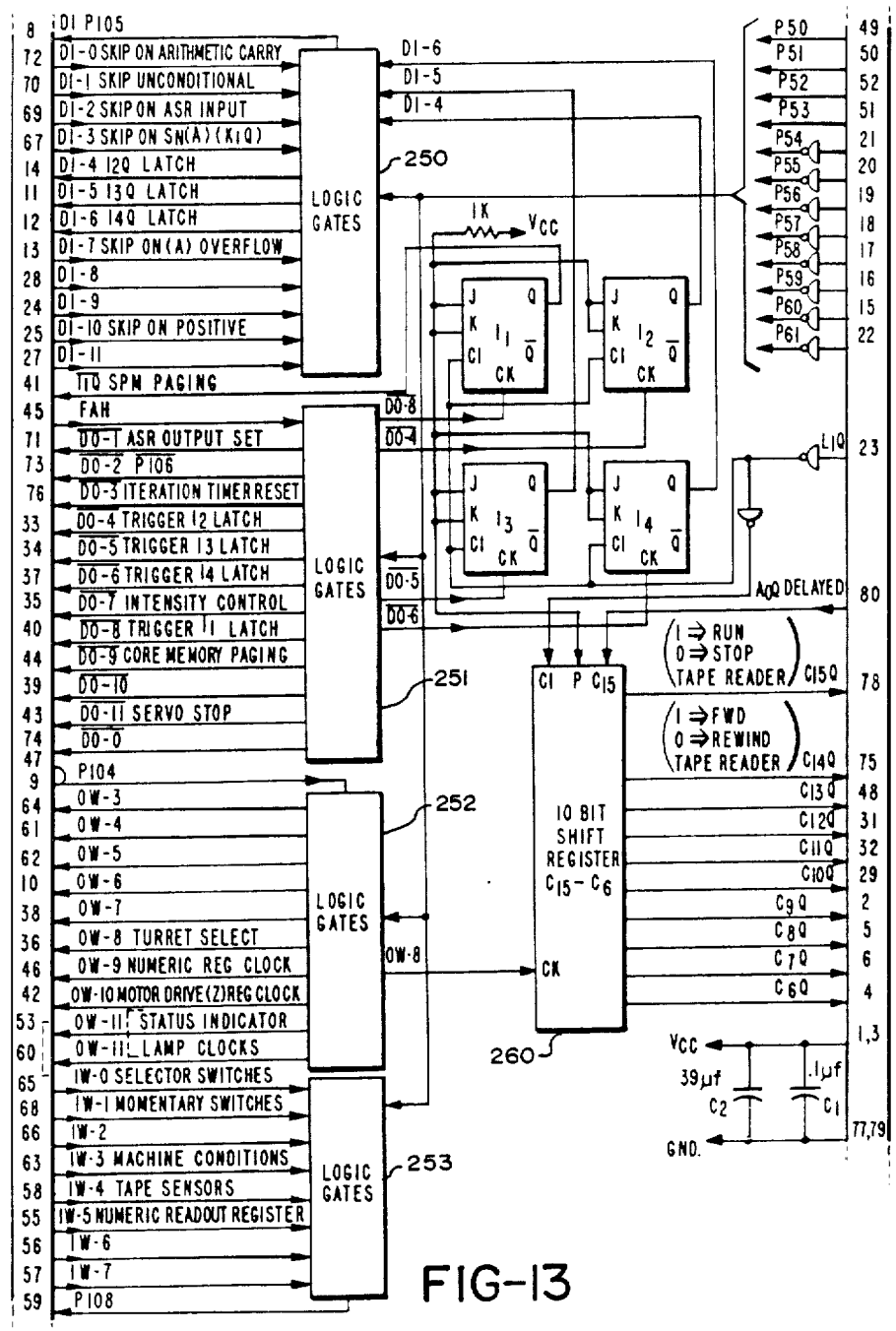
FIG. 13 is a schematic and block diagram representation of the data processor 1FA-1 logic.

As shown in FIG. 13 the IFA-1 printed circuit board contains logic gates 250, 251, 252 and 253 providing input/output functions. The IFA-1 board accepts input and output type instruction micro-operation signals as well as address signals to encode or decode the various inputs and outputs. The input and output words are exchanged with the A-Register in the data processor 12 (FIG. 4). The input words (IW) are multiplexed by logic gates 253 into signal P108 which is input to the A-Register. Information is output from the A-Register to the various entities by connecting the entities to A₀Q and clocking a selected entity with a gated clock P104 as determined by logic gates 252, shown as output word (OW) signals. Discrete input signals (DI) are multiplexed into signal P105 by logic gates 250. Discrete output signals are decoded and gated by logic gates 251. Micro-operation FAH provides the gating signal. The discrete input signals are accessed with skip on discrete decision instructions, and each discrete output signal (DO) provides a short negative going pulse when selected with a discrete output instruction. The I-Register flip-flops $I_1$, $I_2$, $I_3$ and $I_4$ perform the function of latches toggled or set with the discrete outputs. The $I_1$ flip-flop is used to directly provide a Scratch Pad Memory paging function. Outputs from the flip flops $I_2$ $I_3$, and $I_4$ become discrete inputs. A C-Register 260 is loaded with output word 8 and used for general system functions. The signals P50-P61 are decoded operand addresses from the data processor.

Figure 14A:
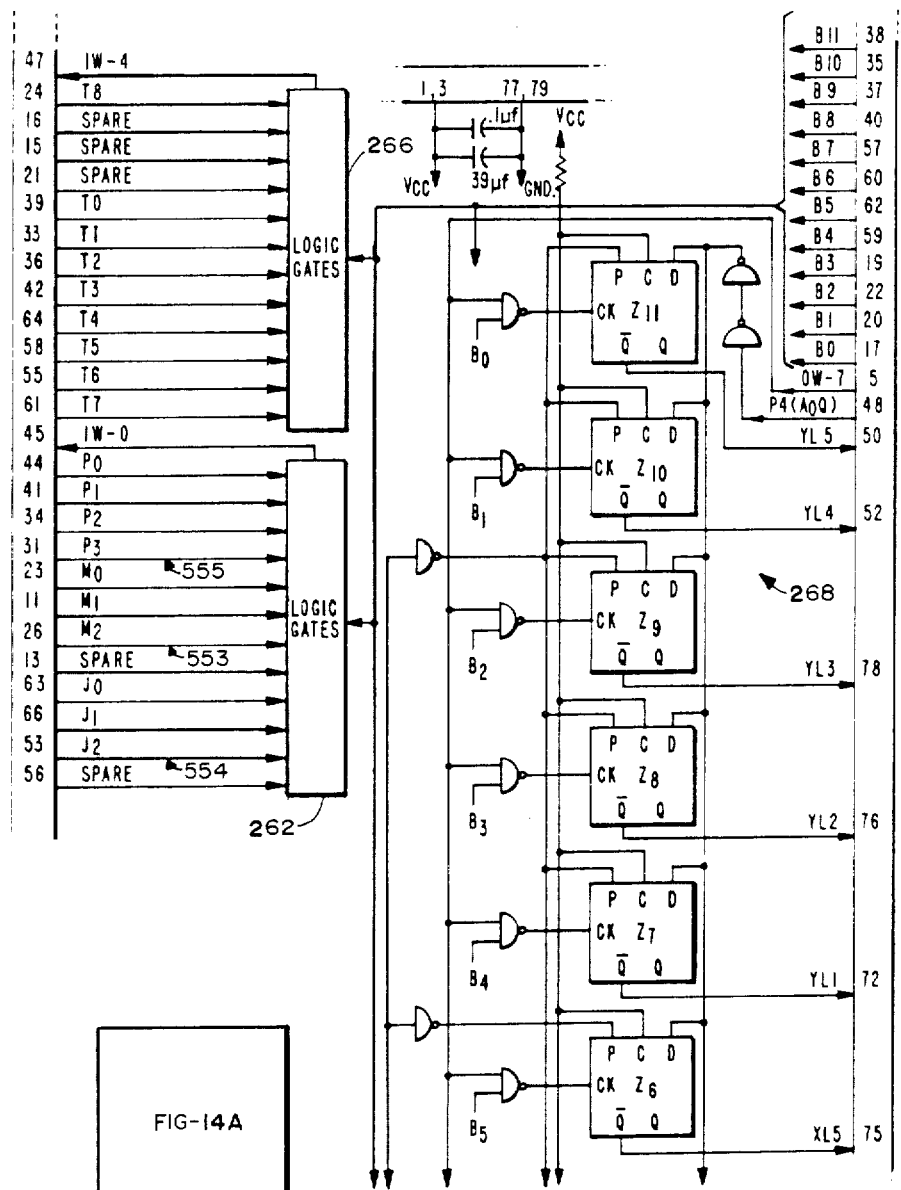
FIGS. 14A and 14B show a schematic and block diagram representation of the data processor 1FA-2 logic and FIG. 14C shows how
Figure 14C:
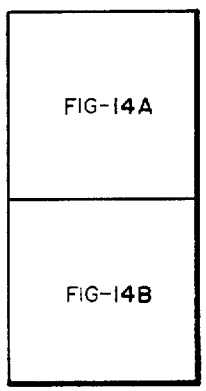
Figure 14B:
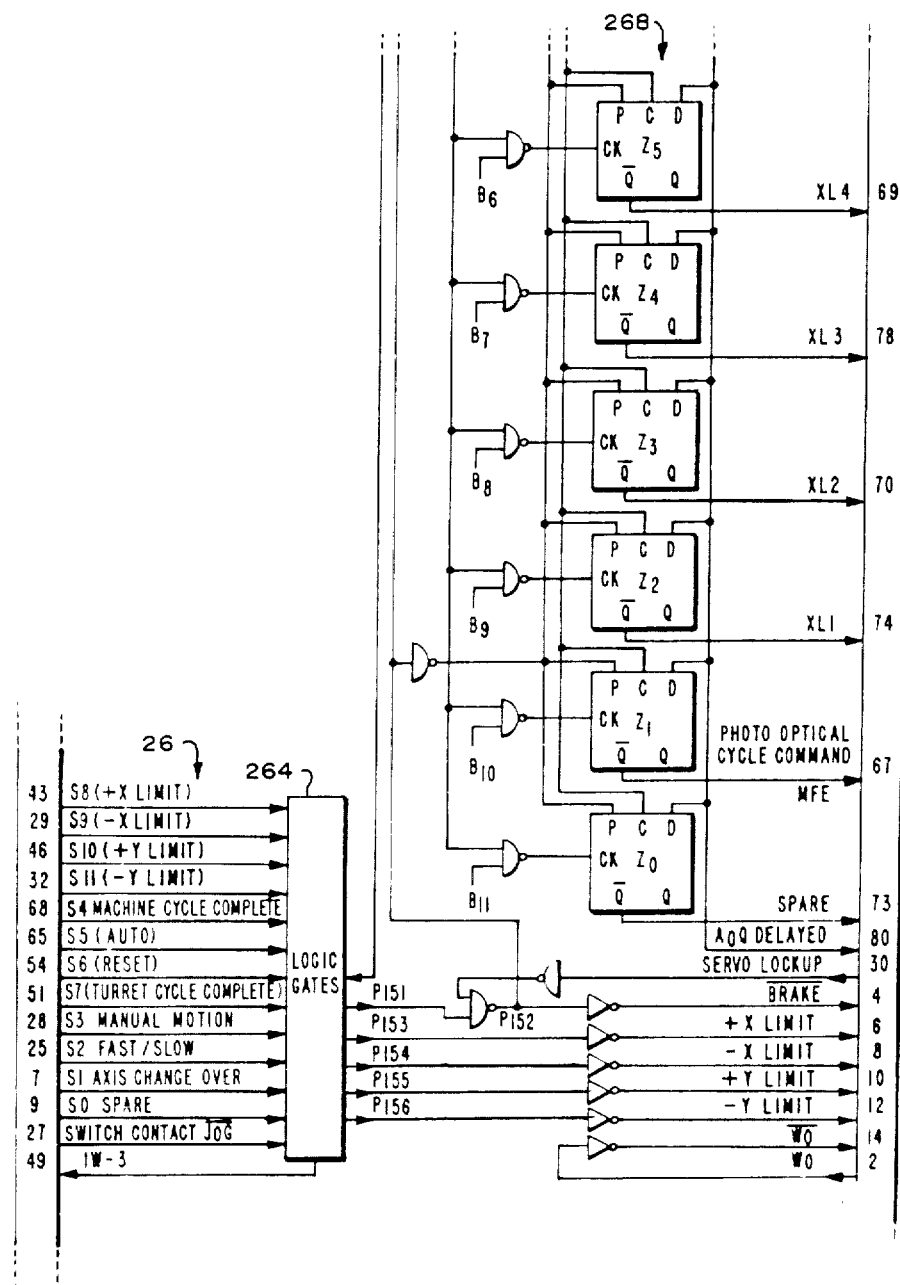

As shown in FIGS. 14A and 14B, the IFA-2 printed circuit board provides for the scan-in of input words "zero", "three", and "four" to convert the parallel input lines to a serial input that can be processed with the input word multiplexer on the IFA-1 card. Logic gates 262 scan control panel selector switch signals into input word −0, logic gates 264 scan nonsystem adapted machine auxiliary control signals 26 (FIG. 1) into input word −3 and logic gates 266 scan rudimentary intrinsic tape reader input signals into input word −4.

The Z-Register 268 includes flip-flops $Z_{11}$ through $Z_0$ and is a static register loaded with output word −7 to set system discrete conditions such as for machine control. It should be noted that this register does not have ambiguous outputs during the shift frame due to selective clocking of the flip-flops in this register.

Figure 15:
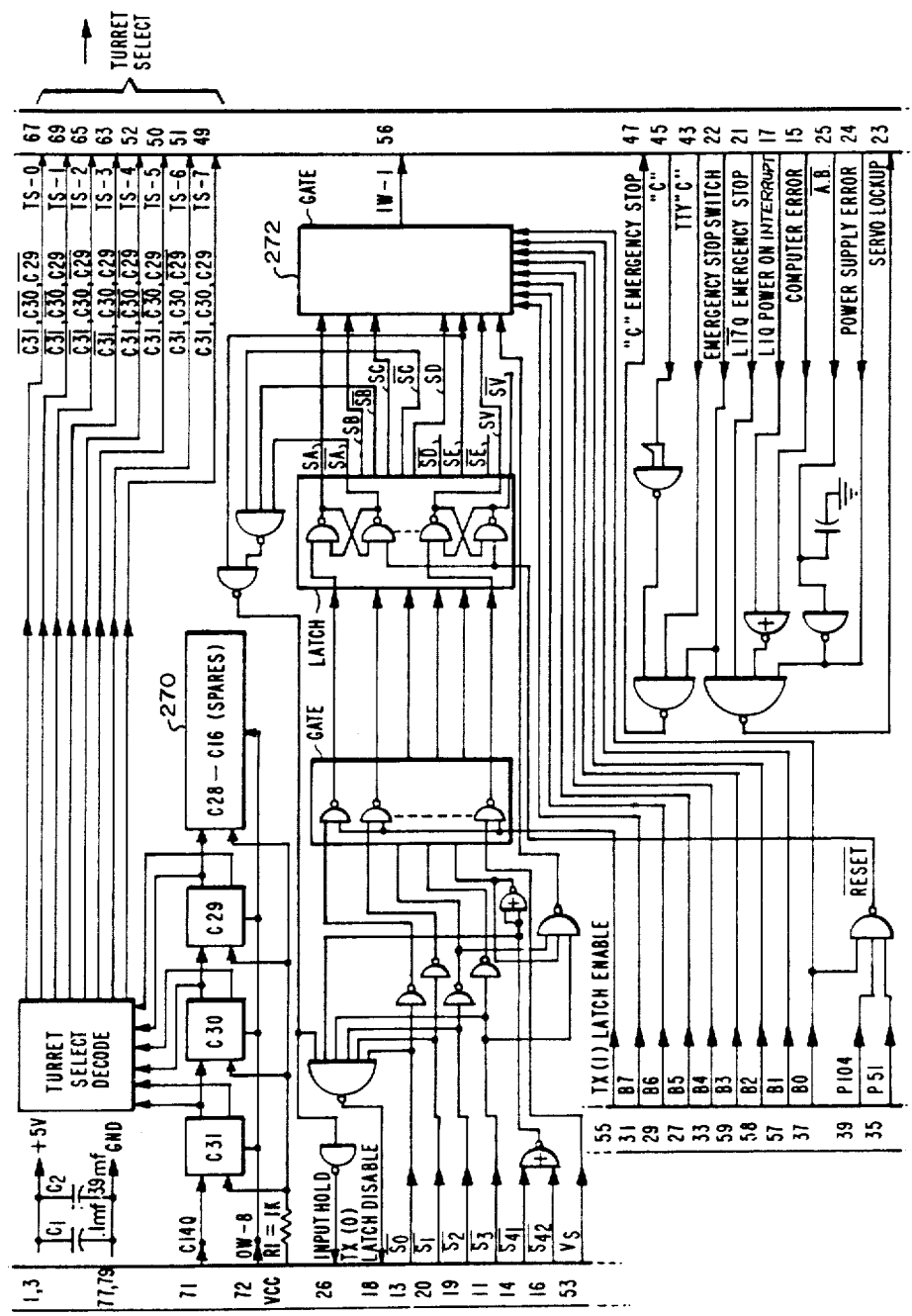
FIG. 15 is a schematic and block diagram representation of the data processor 1FA-3 logic.

As shown in FIG. 15, the IFA-3 printed circuit board provides an extension 270 ($C_{31}$ through $C_{16}$) to the C-Register on IFA-1 (FIG. 13) and performs the auxiliary function of decoding some of the discrete conditions for machine turret select 271. Logic gates 272 provide the input gating, latching and logical functions associated with the momentary switch logic inputs from the control panel and multiplex them into input word −1. In addition, special gating for computer interrupts is provided and the servo lockup signal is used to disable the machine drives when a detrimental condition is sensed.

The interface assembly (IFA-1, IFA-2 and IFA-3) is not an interface in the conventional sense but constitutes a distributed group of functions that are normally associated with the data processor or the various system entities. The interface assembly also performs the function of signal distribution between the data processor and various system extremities.

TABLE I

A-Register $A_{15}D = FAD \cdot [(K_2Q \cdot P50)+(K_3Q \cdot P51)+(K_4Q \cdot P52)+(K_5Q \cdot P53)] +$
$(FAQ \cdot SPM_0Q)+(FAB \cdot P108)+(FAE \cdot K_1Q)+A_0Q \cdot FW \cdot SPM_0Q +$
$A_0Q[FAC+FAF+WO+(FD+FG) \cdot (B_3Q+B_2Q)]+(FT+FU+FX)$ ($\Sigma A$)
$\overline{A_N \text{ Clock}} = [FAQ+FAB+FAE+FW+FAC+FAD+FAF+WO+FT+FU+FX+$
$(FD+FG) \cdot (B_3Q+B_2Q)]$ A-Adder $\Sigma A = [(P2 \cdot FB)+(FT+FU+FX) \cdot A_0Q+FC] \oplus [FU \oplus SPM_0Q] \oplus [K_7Q+FU \cdot B15]$
$\overline{A_C} = A_0Q \cdot P18+FB \cdot P2$
$A^* = \overline{FC}$
$A_1 = A_2 = B_1 = B_2 =$ Ground
$\overline{B_C} = P85 \oplus FU$
$C_N = K_7Q+FU \cdot B15$
$C_{N+1}A = [(P2 \cdot FB)+(FT+FU+FX) \cdot A_0Q+FC] \cdot [FU \oplus SPM_0Q] +$
$[(P2 \cdot FB)+(FT+FU+FX) \cdot A_0Q+FC] \cdot [K_7Q+FU \cdot B15] +$
$[FU \oplus SPM_0Q] \cdot [K_7Q+FU \cdot B15]$ B Flip Flops $B_0T = B0[\overline{D_0Q} \cdot (C_3Q \cdot \overline{C_2Q} \cdot \overline{C_1Q} \cdot C_0Q \cdot K_{11}Q \cdot WO)+\overline{Y_6} \cdot W1 \cdot \overline{C_3Q} \cdot C_2Q+FAB+FAC+$
$FAD+FAH]$ TABLE I-continued $B_0$ Clock = $\overline{P3\Delta}$
$B_1T = B_0Q + B0 \cdot [\overline{D_1Q} \cdot (C_3Q \cdot \overline{C_2Q} \cdot \overline{C_1Q} \cdot C_0Q \cdot K_{11}Q \cdot W0) + \overline{Y6} \cdot W1 \cdot \overline{C_3Q} \cdot C_2Q + FAB + FAC + FAD + FAH]$
$B_1$ Clock = $\overline{P3\Delta}$
$B_2T = B_0Q + B_1Q + B0 \cdot [\overline{D_2Q} \cdot (C_3Q \cdot \overline{C_2} \cdot \overline{C_1Q} \cdot C_0Q \cdot K_{11}Q \cdot WO) + \overline{Y6} \cdot W1 \cdot \overline{C_3Q} \cdot C_2Q + FAB + FAC + FAD + FAH + W3 \cdot Y11 + C_2Q \cdot C_3Q \cdot W0 + K_2Q \cdot \overline{K_1Q} \cdot W0 + \overline{Y11} \cdot W0 + W6]$
$B_2$ Clock = $\overline{P3\Delta}$
$B_3T = B_0Q + B_1Q + B_2Q + B0 \cdot [(\overline{D_3Q} \cdot (C_3Q \cdot \overline{C_2Q} \cdot \overline{C_1Q} \cdot C_0Q \cdot K_{11}Q \cdot W0) + \overline{Y6} \cdot W1 \cdot \overline{C_3Q} \cdot C_2Q + FAB + FAC + FAD + FAH + W1 + W4 + W5 + FE + FM]$
$B_3$ Clock = $\overline{P3\Delta}$ C-Register $C_0D = I4$
$\overline{C_0}$ Clock = $\overline{P3} \cdot B0 \cdot (FAM + FZ)$
$C_1D = I5$
$\overline{C_1}$ Clock = $\overline{P3} \cdot B0 \cdot (FAM + FZ)$
$C_2D = I6 \cdot \overline{(FAM + FZ)}$
$\overline{C_2}$ Clock = $\overline{P3} \cdot B0 \cdot (FR + FS + FAI + FJ + FAM + FZ)$
$C_3D = I7$
$\overline{C_3}$ Clock = $\overline{P3} \cdot B0 \cdot (FAM + FZ)$ D-Register $D_{11}D = P2 \cdot (FC + FC) + B11 \cdot FJ + B10 \cdot (FR + FS) + M_0Q \cdot FK + \Sigma A \cdot FB + (FD + FG)$
$(B_3Q \cdot B_2Q) \cdot A_0Q$
$\overline{D_N}$ Clock = P3 [FJ + FK + FR + FS + FD + FG $\cdot (B_3Q + B_2Q) \cdot W0$]

M-Register $M_{11}D = P43 = B9 \cdot FAL + (FD + FY) \cdot SPM_0Q + D_0Q \cdot FR + FK \cdot K_7Q + (\Sigma M \cdot B10) \cdot (FAI + FAG \cdot P105) + (\Sigma M \cdot B11) \cdot [FAG \cdot P105 + (\overline{B_3Q} + \overline{B_2Q}) \cdot W0 + FS + FO + FG + FJ]$
$\overline{M_N} = \overline{\text{Clock}} = P42 = \overline{P3} \cdot [(B_3Q + B_2Q) \cdot (FAL + FY) + FK + FR + FD + FAI + FAG \cdot P105 + (\overline{B_3Q} + \overline{B_2Q}) \cdot W0 + FS + FO + FG + FJ]$ M-Adder $\Sigma M = M_0Q \oplus K_8Q \oplus P44$
$A_1 = A_2 = B_1 = B_2 = $ Ground
$C_N = K_8Q$
$V_{N+1} M = (M_0Q \cdot K_8Q) + (M_0Q \cdot P43) + (K_8Q \cdot P43)$
$\overline{A_C} = M_0Q$
$\overline{B_C} = P_{44}A$
$\overline{B^*} = P_{44} B$ W Flip Flops $W_0T = FR + FS + FJ + [FZ \cdot \overline{L_1Q} \cdot \overline{(\text{interrupt} + K_1Q)}]$
$W_0$ Clock = $P3 \cdot B0$
$W_1T = W0 + FZ \cdot Y_{10}$
$W_1$ Clock = $P3 \cdot B0$
$W_2T = W_0Q \cdot W_1Q$
$W_2$ Clock = $P3 \cdot B0$ Z-Register $Z_ND = A_0Q$ (Delayed)
$\overline{Z_N}$ Clock = $OW - 7 \cdot Bi$, where $i = 11-N$ $C_{15-6}$-Register $C_{15}D = A_0Q$ (Delayed)
$C_N$ Clock = OW-8 (Turret Select)

K-Register $K_0D = FB$
$\overline{K_0}$ Clock = $\overline{P3} \cdot B14$
$K_1D = (FA + FB) \cdot C_3Q \cdot A_0Q + FV + \overline{Y10} \cdot FZ + FC \cdot \Sigma A$
$\overline{K_1}$ Clock = $\overline{P3} \cdot B0 \cdot [FV + FL + W0 + W7 + \overline{(Y10 + C_3Q)} \cdot FZ]$
$K_2D = FAD \cdot A_0Q + FC$
$\overline{K_2}$ Clock = $\overline{P3} \cdot (FZ + FAD + Wy)$
$K_3D = FAD \cdot K_2Q + FL + FV \cdot D_0Q$
$\overline{K_3}$ Clock = $\overline{P3} \cdot [C_3Q \cdot FZ + FL \cdot B11 + B0 \cdot W0 + B0 \cdot W7 + FV + FAD]$
$K_4D = FL \cdot Y4 + FV \cdot D_1Q + FAD \cdot K_3Q$
$\overline{K_4}$ Clock = $\overline{P3} \cdot [C_3Q \cdot FZ + FL \cdot B11 + B0 \cdot W0 + B0 \cdot W7 + FV + FAD]$
$K_5D = Y2 \cdot W0 + FV \cdot D_2Q + FAD \cdot K_4Q + FL \cdot K_5Q$
$\overline{K_5}$ Clock = $\overline{P3} \cdot [C_3Q \cdot FZ + FL \cdot B11 + B0 \cdot W0 + B0 \cdot W7 + FV + FAD]$
$K_7D = A \cdot [C_{N+1}A \cdot \overline{B0} \cdot FK \cdot \overline{FX} + FK \cdot D_0Q]$
$\overline{K_7}$ Clock = $\overline{P3} \cdot [FK + FAQ + FAB + FAE + FW + FAC + FAF + FAD + FT + FU + FX + W0 + (FD + FG) \cdot (B_3Q + B_2Q)]$
$K_8D = C_{N+1}M \cdot \overline{B0}$
$\overline{K_8}$ Clock = $\overline{P3} \cdot [(B_3Q + B_2Q) \cdot (FAL + FY) + FK + FR + FD + FAI + FAG \cdot P105 + (\overline{B_3Q} + \overline{B_2Q}) \cdot W0 + FS + FO + + FG + FJ]$
$K_{10}D = I2$
$\overline{K_{10}}$ Clock = $\overline{P3} \cdot B0 \cdot (FAM + FZ)$
$K_{11}D = I3$
$\overline{K_{11}}$ Clock = $\overline{P3} \cdot B0 \cdot (FAM + FZ)$ I Flip Flop (FIG. 13)

$I_1T = V_{CC}$
$\overline{I_1}$ Clock = D0-8
$I_2T = V_{CC}$
$\overline{I_2}$ Clock = D0-4
$I_3T = V_{CC}$
$\overline{I_3}$ Clock = D0-5
$I_4T = V_{CC}$

TABLE I-continued $\overline{I_4}$ Clock = D0-6
L-Register
$L_1D = 0$
$L_1P = \overline{L_2Q}$ (Power Supply Active Signal)
$L_1$ Clock = $\overline{P106}$ = Discrete Output 2
$L_2D = P87$
$L_2$ Clock = W0
A Overflow Flip-Flop ($OF_i$)
$OF_iD = \overline{(A_0Q \cdot P18) \cdot (FB \cdot P2) \cdot (P85 \oplus FU) \cdot K_7Q} + A_0Q \cdot P18 + FB \cdot P2 \cdot (P85 \oplus FU) \cdot \overline{K_7Q}$
$\overline{OF_i}$ Clock = $(FT + FU) \cdot \overline{P3}$
Lamp Display Register ($L_3$-$L_{15}$)
$L_{15}D = A_0Q$
$L_N$ Clock = OW-11
Numeric Display Register ($N_0$-$N_{15}$)
$N_{15}D = A_0Q$
$N_N$ Clock = OW-9

TABLE II

P Terms
P0 = ΣA
P1 = ΣM
P2 = $[I0 \cdot B7 + I1 \cdot B6 + I2 \cdot B5 + I3 \cdot B4 + I4 \cdot B3 + I5 \cdot B2 + I6 \cdot B1 + I7 \cdot B0] \cdot [FDF + FG] +$
$(B13 \cdot I2) \cdot (\overline{C_3Q} + C_2Q + C_1Q + \overline{C_0Q}) + I1 \cdot B14 + I0 \cdot B15 + I4 \cdot B11 \cdot C_3Q \cdot C_2Q +$
$(I3 \cdot B12) \cdot [(\overline{C_3Q} + \overline{C_0Q}) + (C_3Q \cdot C_2Q \cdot C_1Q \cdot C_0Q)]$
P3 = $\overline{P109 \cdot B_4Q} = \overline{(B_5Q \cdot B158MHz \cdot B15) \cdot B_4Q}$ = Master Clock
P3Δ = P3 delayed clock
P4 = $A_0Q$
P7 = $\overline{(C_1Q \cdot C_0Q} + K_{11}Q)K_{10}Q \cdot \overline{K_0Q} \cdot D_1Q \cdot D_0Q$
P11 = $\overline{C_3Q} \cdot C_2Q$
P12 = $C_0Q \cdot \overline{C_1Q} \cdot \overline{C_2Q} \cdot C_3Q$
P14 = $C_3Q \cdot \overline{C_2Q} \cdot \overline{C_1Q} \cdot C_0Q \cdot K_{11}Q \cdot W0$
P15 = $C_2Q \cdot C_3Q$
P16 = $Y38 \cdot C_0Q \rightarrow FT + FU$
P17 = $FW + FX + FU + FT + FAC + FAQ$
P18 = $FT + FU + FX$
P21 = $B_2Q + B_3Q$
P22 = $\overline{B_2Q} + \overline{B_3Q}$
P24 = $B0 \cdot \overline{P3}$ = B0(Early Clock)
P25 = $\overline{K_1Q} \cdot K_2Q$
P26 = $K_4Q + K_5Q$
P27 = $\overline{Y11 \cdot K_5Q \cdot K_1Q}$
$\overline{P28}$ = $FAD \cdot (K_2Q \cdot P50 + K_3Q \cdot P51 + K_4Q \cdot P52 + K_5Q \cdot P53) + FAQ \cdot P85$
P29 = $FA + FC$
P30 = $FC + FB$
P31 = $FA + FB$
P33 = $W3 \cdot Y11 + (C_2Q \cdot C_3Q + \overline{K_1Q} \cdot K_2Q + \overline{Y1})W0 + W6$
P35 = $W0 + W7$
P36 = $W2 + W5$
P37 = $FD \cdot FG$
P38 = $W1 + W4 + W5 + W2 \cdot \overline{Y11}$
P39 = $FAM + FZ$
P40 = $(FR + FS + FAI + FJ) + (FAM + FZ)$
P41 = $FR + FS$
P42 = $\overline{P3} \cdot [(B_3Q + B_2Q) \cdot (FAL + FY) + FK + FR + FD + FAI + FAG \cdot P105 + \overline{(B_3Q + B_2Q)} \cdot W0 + FS + FO + FG + FJ]$
P44 = P44A + P44B = $B10 \cdot (FAI + FAG \cdot P105) + B11 \cdot (FAG \cdot P105 + \overline{B_2Q} \cdot W0 + \overline{B_3Q} \cdot W0 + FS + FO + FG + FJ)$
P44A = $(FAI + FAG \cdot P105)B10$
P44B = $(FAG \cdot P105 + (\overline{B_2Q} + \overline{B_3Q})W0 + FS + FO + FG + FJ)B11$
P47 = $W1 \cdot SPM_0Q \cdot \overline{FY} \cdot \overline{C_3Q} \cdot C_2Q + P2 \cdot (FN + FQ) + [FD + (B_3Q + B_2Q) \cdot (FAL + FY)(B_3Q + B_2Q)]M_0Q + P88$
P48 = $FAL + FY + FN + FQ + \overline{B_2Q} \cdot FE + FW + FX + FU + FT + FAC + FC + FB + FD + FAQ$
P50 = $P133 \cdot \overline{A} \cdot \overline{B} \cdot \overline{C}$
P51 = $P133 \cdot \overline{A} \cdot \overline{B} \cdot C$
P52 = $P133 \cdot \overline{A} \cdot B \cdot \overline{C}$
P53 = $P133 \cdot \overline{A} \cdot B \cdot C$
P54 = $P133 \cdot A \cdot \overline{B} \cdot \overline{C}$
P55 = $P133 \cdot A \cdot \overline{B} \cdot C$
P56 = $P133 \cdot A \cdot B \cdot \overline{C}$
P57 = $P133 \cdot A \cdot B \cdot C$
P58 = $P134 \cdot \overline{A} \cdot \overline{B} \cdot \overline{C}$
P59 = $P134 \cdot \overline{A} \cdot \overline{B} \cdot C$
P60 = $P134 \cdot \overline{A} \cdot B \cdot \overline{C}$
P61 = $P134 \cdot \overline{A} \cdot B \cdot C$
P62 = $P134 \cdot A \cdot \overline{B} \cdot \overline{C}$
P63 = $P134 \cdot A \cdot \overline{B} \cdot C$
P64 = $P134 \cdot A \cdot B \cdot \overline{C}$
P65 = $P134 \cdot A \cdot B \cdot C$
A = $FAL + W0 \cdot B_3Q + Y11 \cdot FY \cdot \overline{W1} \cdot D_0Q$
B = $W0 \cdot K_4Q + Y11 \cdot \overline{FY} \cdot W1 \cdot D_1Q + FY + \overline{Y11} \cdot W0$

TABLE II-continued $C = W0 \cdot K_5Q + Y11 \cdot FY \cdot W1 \cdot D_2Q$
$P85 = SPM_0Q$ (multiplexed output of all scratch pad memory registers)
$P87 = $ Lower-on signal
$P88 = FAQ \cdot SPM_0Q + FB \cdot SPM_0Q + FC \cdot \Sigma A + FAC \cdot A_0Q$
$P89 = $ External interrupt
$P90 = (FR + FS) + (FD + FG)$
$P91 = Y6 \cdot W1 \cdot \overline{C_3Q} \cdot C_2Q + FAB + FAC + FAD + FAH$
$P92 = B7 \cdot B_4Q \cdot (P36 + P91) = $ Cycle initiate command
$P93 = B3 \cdot B_4Q \cdot (P36 + P91) = $ Restore command
$\overline{P97} = (FAL + FY)(B_3Q + B_2Q)$
$P98 = FAL + FY$
$P99 = \overline{\Sigma A \cdot FB}$
$P101 = \overline{B11 \cdot I4 \cdot C_2Q \cdot C_3Q}$
$P102 = \overline{(C_0Q \cdot C_3Q) + (\overline{C_0Q} \cdot C_1Q \cdot C_2Q \cdot C_3Q)}$
$P103 = \overline{(K_5Q \cdot Y11)(M_9Q + M_{10}Q + M_{11}Q)} = $ Core memory read/write mode
$P104 = \overline{P3 \cdot FAB}$
$P105 = P50 \cdot DI - 0 + P51 \cdot DI - 1 + P52 \cdot DI - 2 + P53 \cdot DI - 3 + P54 \cdot DI - 4 + P55 \cdot DI - 5 + P56 \cdot DI - 6 + P57 \cdot DI - 7 + P58 \cdot DI - 8 + P59 \cdot DI - 9 + P60 \cdot DI - 10 + P61 \cdot DI - 11$
(Discrete Input DI-n To Data Processor)
$P106 = FAH \cdot P51 = DO - 2$ (Resets $L_1$ flip flop during Power turn-on)
$P108 = IW - 0 \cdot P50 + IW - 1 \cdot P51 + IW \cdot 2 \cdot P52 + IW - 3 \cdot P53 + IW - 4 \cdot P54 + IW - 5 \cdot P55 + IW - 6 \cdot P56 + IW - 7 \cdot P57$
$P109 = B_5Q \cdot B15 + \overline{8mc \cdot B15}$
$P110 = \overline{M_9Q} + \overline{M_{10}Q} + \overline{M_{11}Q}$
$P111 = I6 \cdot P59 = \overline{I6(FAM + FZ)}$
$P112 = (FR + FS + FAI + FJ + FAM + FZ)B0 \cdot \overline{P3}$
$P113 = (FAM + FZ)B0 \cdot \overline{P3}$
$\overline{P114} = (FAI + FAG \cdot P105 + (\overline{B_3Q} + \overline{B_2Q}) \cdot W0 + FS + FO + FG + FJ$
$P115 = FAQ + FAB$
$P116 = \overline{(FAB + FAG + FAH)I_1Q}$
$P120 = SPM_0Q$ (multiplexed output of a group of 4 scratch pad memory registers)
$P121 = SPM_0Q$ (multiplexed output of a group of 4 scratch pad memory registers)
$\overline{P133} = Y11 \cdot \overline{FY} \cdot W1 \cdot \overline{D_4Q} \cdot D_3Q$
$\overline{P134} = Y11 \cdot \overline{FY} \cdot W1 \cdot \overline{D_4Q} \cdot D_3Q$
$\overline{P135} = Y11 \cdot \overline{FY} \cdot W1 \cdot D_4Q \cdot \overline{D_3Q}$
$\overline{P136} = Y11 \cdot FY \cdot W1 \cdot D_4Q \cdot D_3Q$
$\overline{P151} = JOG \cdot (\overline{S8} + \overline{S9} + \overline{S10} + \overline{S11})$
$P152 = $ Servo Lockup $+ \overline{JOG} \cdot (\overline{S8} + \overline{S9} + \overline{S10} + \overline{S11})$
$P153 = \overline{S8}$
$P154 = \overline{S9}$
$P155 = \overline{S10}$
$P156 = \overline{S11}$
$P158 = \overline{Y11 \cdot K_5Q \cdot W2}$
$P511 = FN + FQ$ Memory Output Lines
I7 - Most Significant Bit
I6 - Second Most Significant Bit
I5 - Third Most Significant Bit
I4 - Fourth Most Significant Bit
I3 - Fifth Most Significant Bit
I2 - Sixth Most Significant Bit
I1 - Seventh Most Significant Bit
I0 - Least Most Significant Bit Y Terms
$Y1 = \overline{(C_1Q \cdot C_0Q + K_{11}Q)K_{10}Q \cdot \overline{K_9Q} \cdot D_1Q \cdot D_0Q + Y6 + K_1Q \cdot K_2Q}$
$Y2 = \overline{Y11 \cdot K_{11}Q \cdot K_{10}Q \cdot C_1Q \cdot C_0Q \cdot D_1Q \cdot D_0Q}$
$Y3 = \overline{C_3Q \cdot C_2Q \cdot C_1Q \cdot C_0Q \cdot K_{11}Q \cdot K_{10}Q \cdot I1 \cdot I0}$
$Y4 = K_1Q \cdot K_2Q + Y6$
$Y5 = Y3 + K_2Q$
$Y6 = C_1Q \cdot \overline{C_0Q} \cdot \overline{K_{11}Q} \cdot D_0Q$
$Y7 = \overline{L_3Q} + K_1Q$
$Y10 = \overline{(P89 + Y7)L_1Q}$
$Y11 = C_2Q + C_3Q$
$Y38 = Y6 \cdot W1 \cdot \overline{C_3Q} \cdot C_2Q$
$Y39 = C_3Q \cdot \overline{C_2Q} \cdot W1$ B Terms
$B0 = \overline{B_3Q} \cdot \overline{B_2Q} \cdot \overline{B_1Q} \cdot \overline{B_0Q}$
$B1 = \overline{B_3Q} \cdot \overline{B_2Q} \cdot \overline{B_1Q} \cdot B_0Q$
$B2 = \overline{B_3Q} \cdot \overline{B_2Q} \cdot B_1Q \cdot \overline{B_0Q}$
$B3 = \overline{B_3Q} \cdot \overline{B_2Q} \cdot B_1Q \cdot B_0Q$
$B4 = \overline{B_3Q} \cdot B_2Q \cdot \overline{B_1Q} \cdot \overline{B_0Q}$
$B5 = \overline{B_3Q} \cdot B_2Q \cdot \overline{B_1Q} \cdot B_0Q$
$B6 = \overline{B_3Q} \cdot B_2Q \cdot B_1Q \cdot \overline{B_0Q}$
$B7 = \overline{B_3Q} \cdot B_2Q \cdot B_1Q \cdot B_0Q$
$B8 = B_3Q \cdot \overline{B_2Q} \cdot \overline{B_1Q} \cdot \overline{B_0Q}$
$B9 = B_3Q \cdot \overline{B_2Q} \cdot \overline{B_1Q} \cdot B_0Q$
$B10 = B_3Q \cdot \overline{B_2Q} \cdot B_1Q \cdot \overline{B_0Q}$
$B11 = B_3Q \cdot \overline{B_2Q} \cdot B_1Q \cdot B_0Q$
$B12 = B_3Q \cdot B_2Q \cdot \overline{B_1Q} \cdot \overline{B_0Q}$
$B13 = B_3Q \cdot B_2Q \cdot \overline{B_1Q} \cdot B_0Q$
$B14 = B_3Q \cdot B_2Q \cdot B_1Q \cdot \overline{B_0Q}$
$B15 = B_3Q \cdot B_2Q \cdot B_1Q \cdot B_0Q$

TABLE II-continued $W0 = \overline{W_2Q} \cdot \overline{W_1Q} \cdot \overline{W_0Q}$
$W1 = \overline{W_2Q} \cdot \overline{W_1Q} \cdot W_0Q$
$W2 = \overline{W_2Q} \cdot W_1Q \cdot \overline{W_0Q}$
$W3 = \overline{W_2Q} \cdot W_1Q \cdot W_0Q$
$W4 = W_2Q \cdot \overline{W_1Q} \cdot \overline{W_0Q}$
$W5 = W_2Q \cdot \overline{W_1Q} \cdot W_0Q$
$W6 = W_2Q \cdot W_1Q \cdot \overline{W_0Q}$
$W7 = W_2Q \cdot W_1Q \cdot W_0Q$ Input Words
IW−0 = B11·P3+B10·P2+B9·P1+B8·P0+B7·Spare+B6·J2+B5·J1+B4·J0+B3·M2+B2·M1+B1·M0+B0·Spare (Selector Switch Scanout and Input Channel-0)
IW-1 = B7·S+B6·SB+B5·SC+B4·SD+B3·SE+B2·Spare+B1·SV+B0·SJ (Momentary Switch Scanout and Input Channel-1)
IW-2 = Spare
IW-3 = B11·S11+B10·S10+B9·S9+B8·S8+B7·S7+B6·S6+B5·S5+B4·S4+B3·S3+B2·S2+B1·S1+B0·Spare (Auxiliary Control Signals)
IW-4 =0 B11·T0+B10·T1+B9·T2+B8·T3+B7·T4+B6·T5·T6+B4·T7+B3·Spare+B2·Spare+B1·Spare+B0·T8 (Elemental Tape Reader Inputs)
IW-5 = $NRR_0Q$ (Numeric Display Register)
IW-6 = Spare
IW-7 = Spare Output Words
OW-3 = $\overline{P53 \cdot P104}$
OW-4 = $\overline{P54 \cdot P104}$
OW-5 = $\overline{P55 \cdot P104}$
OW-6 = $\overline{P56 \cdot P104}$
OW-7 = $\overline{P57 \cdot P104}$
OW-8 = $\overline{P58 \cdot P104}$
OW-9 = $\overline{P59 \cdot P104}$
OW-10 = $\overline{P60 \cdot P104}$
OW-11 = $\overline{P61 \cdot P104}$ Discrete Outputs
DO-0 = FAH·P50
DO-1 = FAH·P51
DO-2 = FAH·P52
DO-3 = FAH·P53
DO-4 = FAH·P54
DO-5 = FAH·P55
DO-6 = FAH·P56
DO-7 = FAH·P57
DO-8 = FAH·P58
DO-9 = FAH·P59
DO-10 = FAH·P60
DO-11 = FAH·P61

TABLE III $FA = W0 \cdot \overline{K_1Q} \cdot (B15 \cdot Y3 + K_2\overline{Q})$
$FB = W0 \cdot K_1Q \cdot (\overline{B15 \cdot Y3 + K_2Q})$
$FC = W0 \cdot (B15 \cdot \overline{C_3Q} \cdot \overline{C_2Q} \cdot C_1Q \cdot \overline{C_0Q} \cdot \overline{K_{11}Q} \cdot K_{10}Q \cdot I_1 \cdot \overline{I_0} + K_2Q)$
$FD = \overline{C_3Q} \cdot \overline{C_2Q} \cdot K_5Q \cdot W1$
$FE = \overline{C_3Q} \cdot \overline{C_2Q} \cdot K_5Q \cdot W2$
$FF = \overline{C_3Q} \cdot \overline{C_2Q} \cdot K_5Q \cdot W3$
$FG = \overline{C_3Q} \cdot \overline{C_2Q} \cdot K_5Q \cdot W4$
$FH = \overline{C_3Q} \cdot \overline{C_2Q} \cdot K_5Q \cdot W5$
$FI = \overline{C_3Q} \cdot \overline{C_2Q} \cdot K_5Q \cdot W6$
$FJ = \overline{C_3Q} \cdot \overline{C_2Q} \cdot (\overline{K_4Q} + K_5Q) \cdot W7$
$FK = \overline{C_3Q} \cdot \overline{C_2Q} \cdot K_5Q \cdot (B11 \cdot Y1 + K_3Q) \cdot \overline{FAI}$
$FL = \overline{C_3Q} \cdot \overline{C_2Q} \cdot K_5Q \cdot (B11 \cdot Y1 + K_3Q) \cdot W1$
$FM = \overline{C_3Q} \cdot \overline{C_2Q} \cdot K_5Q \cdot \overline{K_1Q} \cdot W2$
$FN = \overline{C_3Q} \cdot \overline{C_2Q} \cdot K_5Q \cdot \overline{K_1Q} \cdot W3$
$FO = \overline{C_3Q} \cdot \overline{C_2Q} \cdot K_5Q \cdot \overline{K_1Q} \cdot W4$
$FP = \overline{C_3Q} \cdot \overline{C_2Q} \cdot K_5Q \cdot \overline{K_1Q} \cdot W5$
$FQ = \overline{C_3Q} \cdot \overline{C_2Q} \cdot K_5Q \cdot \overline{K_1Q} \cdot W6$
$FR = \overline{C_3Q} \cdot \overline{C_2Q} \cdot K_5Q \cdot K_4Q \cdot \overline{K_3Q} \cdot \overline{K_1Q} \cdot W7$
$FS = \overline{C_3Q} \cdot \overline{C_2Q} \cdot K_5Q \cdot K_4Q \cdot K_3Q \cdot \overline{K_1Q} \cdot W7$
$FT = Y38 \cdot \overline{C_1Q} \cdot C_0Q$
$FU = Y38 \cdot C_1Q \cdot C_0Q$
$FV = Y38 \cdot C_1Q \cdot \overline{C_0Q}$
$FW = Y38 \cdot \overline{C_1Q} \cdot \overline{C_0Q} \cdot K_{11}Q$
$FX = Y38 \cdot \overline{C_1Q} \cdot C_0Q \cdot K_{11}Q$
$FY = \overline{C_3Q} \cdot C_2Q \cdot C_1Q \cdot C_0Q \cdot \overline{K_{11}Q} \cdot K_{10}Q \cdot D_0Q \cdot W1$
$FZ = (C_3Q + C_2Q) \cdot W2$
$FAB = C_3Q \cdot \overline{C_2Q} \cdot C_1Q \cdot \overline{C_0Q} \cdot W1$
$FAC = C_3Q \cdot \overline{C_2Q} \cdot \overline{C_1Q} \cdot \overline{C_0Q} \cdot W1$
$FAD = \overline{C_3Q} \cdot \overline{C_2Q} \cdot C_1Q \cdot \overline{K_{11}Q} \cdot W1$
$FAE = C_3Q \cdot \overline{C_2Q} \cdot \overline{C_1Q} \cdot C_0Q \cdot K_{11}Q \cdot \overline{K_{10}Q} \cdot W1$
$FAF = C_3Q \cdot \overline{C_2Q} \cdot \overline{C_1Q} \cdot C_0Q \cdot K_{11}Q$
$FAG = C_3Q \cdot C_2Q \cdot C_1Q \cdot W1$
$FAH = C_3Q \cdot C_2Q \cdot \overline{C_1Q} \cdot W1$
$FAI = \overline{C_3Q} \cdot \overline{C_2Q} \cdot K_2Q \cdot \overline{K_1Q} \cdot W1$
$FAJ = L_1Q \cdot W3$
$FAK = L_1Q \cdot AQ \cdot \overline{P89} \cdot Y7 \cdot W3$
$FAL = K_1Q \cdot W4$
$FAM = K_1Q \cdot W5$
$FAN = K_1Q \cdot W6$
$FAO = K_1Q \cdot W7$
$FAP = \overline{C_3Q} \cdot C_2Q \cdot Y6 \cdot \overline{K_{10}Q} \cdot W1$
$FAQ = C_1Q \cdot C_2Q \cdot Y39$

TABLE IV

| | Logic Card | | | | | | | | | |
|---|---|---|---|---|---|---|---|---|---|---|
| | A | B | C | D | K | W | SPM | IFA-1 | IFA-2 | IFA-3 |
| | | | | | Reference FIG. | | | | | |
| Pin | 6 | 7 | 8 | 9 | 10 | 11 | 12 | 13 | 14 | 15 |
| 1 | Vcc | Vcc | Vcc | Vcc | Vcc | Vcc | Vcc | Vcc | Vcc | Vcc |
| 2 | — | — | — | B14 | P30 | — | — | C9Q | W0 | — |
| 3 | Vcc | Vcc | Vcc | Vcc | Vcc | Vcc | Vcc | Vcc | Vcc | Vcc |

TABLE IV-continued

| | Logic Card | | | | | | | | | |
|---|---|---|---|---|---|---|---|---|---|---|
| | A | B | C | D | K | W | SPM | IFA-1 | IFA-2 | IFA-3 |
| | | | | | Reference FIG. | | | | | |
| Pin | 6 | 7 | 8 | 9 | 10 | 11 | 12 | 13 | 14 | 15 |
| 4 | M6Q | — | — | B15 | FC | — | — | C6Q | — | — |
| 5 | M8Q | — | — | B13 | B15 | P27 | — | C8Q | OW-7 | — |
| 6 | M7Q | B9 | — | P12 | W0 | P24 | — | C7Q | — | — |
| 7 | M10Q | 8MHZ | I2 | I0 | Y11 | FAM | — | — | S1 | — |
| 8 | M9Q | B8 | — | I2 | Y3 | Y11 | — | P105 | — | — |
| 9 | M11Q | — | I3 | B4 | — | FAL | — | P104 | S0 | — |
| 10 | — | B6 | I4 | B7 | — | KIQ | — | OW-6 | — | — |
| 11 | P110 | — | I5 | I5 | — | FD | — | DI-5 | M1 | S3 |
| 12 | P110 | B5 | I7 | A | FAB | P38 | — | DI-6 | — | — |
| 13 | — | — | P113 | I7 | FK | P48 | — | DI-7 | — | S0 |
| 14 | P110 | B4 | P111 | B2 | P27 | — | — | DI-4 | W0 | S41 |
| 15 | FK | — | P112 | I6 | FA1 | K5Q | — | P60 | — | — |
| 16 | FW | B3 | FAG | B0 | Y11 | Y10 | — | P59 | — | S42 |
| 17 | — | — | FV | I4 | FL | W0 | — | P58 | B0 | — |
| 18 | W0 | B2 | P17 | B3 | D0Q | — | — | P57 | — | — |
| 19 | FAD | B0 | FAH | B6 | Y2 | K4Q | — | P56 | B3 | S2 |
| 20 | FAF | B1 | W1 | D0Q | D2Q | W7 | — | P55 | B1 | S1 |
| 21 | P16 | P3 | C3Q | B5 | B11 | K3Q | — | P54 | — | — |
| 22 | P115 | — | P16 | I1 | DIQ | FS | — | P61 | B2 | — |
| 23 | FAC | B4Q | K0Q | P102 | — | — | — | L1Q | M0 | — |
| 24 | FR | — | P7 | P37 | W0 | P36 | — | DI-9 | T8 | — |
| 25 | D0Q | P93 | D1Q | P112 | W1 | P35 | — | DI-10 | S2 | — |
| 26 | P97 | — | — | P40 | W7 | FR | — | — | M2 | TX(0) |
| 27 | P114 | B7 | Y6 | P113 | — | K3Q | — | DI-11 | — | B5 |
| 28 | FY | P92 | FAC | P3 | B0 | W1 | — | DI-8 | S3 | — |
| 29 | P98 | — | FU | B12 | C3Q | FA1 | — | C10Q | S9 | B6 |
| 30 | — | — | FU | P39 | FV | PAJ | P48 | — | — | — |
| 31 | FAB | P3 | Y2 | P101 | Y10 | P87 | — | C12Q | P3 | B7 |
| 32 | P108 | — | FAB | P111 | P99 | FJ | P50 | C11Q | S11 | — |
| 33 | FAE | — | FY | P2 | FB | FJ | — | D0-4 | T1 | B4 |
| 34 | K1Q | B15 | FY | B11 | FAD | P26 | P51 | D0-5 | P2 | — |
| 35 | FC | P36 | I0 | P41 | FZ | P40 | — | D0-7 | B10 | P51 |
| 36 | P28 | B15 | — | P29 | — | W7 | P52 | OW-8 | T2 | — |
| 37 | B0 | P109 | FAF | P4 | P0 | FZ | — | D0-6 | B9 | B0 |
| 38 | FAQ | — | — | P21 | — | P15 | P53 | OW-7 | B11 | — |
| 39 | FAL | — | FAQ | P105 | C3Q | P25 | — | D0-10 | T0 | P104 |
| 40 | P88 | P22 | P12 | P99 | — | W0 | P54 | D0-8 | B8 | — |
| 41 | P21 | — | D1Q | P22 | K1Q | P33 | — | I1Q | P1 | — |
| 42 | B9 | — | — | FAG | K1Q | — | P55 | OW10 | T3 | — |
| 43 | FX | P21 | D0Q | FK | B14 | F0 | — | D0-11 | S8 | TTY"C" |
| 44 | P37 | B0 | — | M0Q | P85 | P37 | P56 | D0-9 | P0 | — |
| 45 | K5Q | — | FAB | FD | P35 | FF | — | FAH | IW-0 | "C" |
| 46 | — | P24 | — | FF | — | P41 | P57 | DW-9 | S10 | — |
| 47 | FD | — | C3Q | B0Δ | — | P98 | — | P104 | IW-4 | "C" |
| 48 | Y11 | P38 | — | FS | P106 | L1Q | P133 | C13Q | P4 | — |
| 49 | B0 | — | P102 | FY | — | P2 | — | P50 | IW-3 | TS-7 |
| 50 | — | D3Q | — | P90 | L2Q | — | C | P51 | YL5 | TS-5 |
| 51 | FU | — | — | Y11 | — | P30 | — | P53 | S7 | TS-6 |
| 52 | — | D2Q | — | W1 | — | P97 | B | P52 | YL4 | TS-4 |
| 53 | B15 | — | — | K3Q | P4 | K1Q | — | OW-11 | J2 | VS |
| 54 | P4 | D1Q | — | K4Q | P3 | K2Q | A | — | S6 | — |
| 55 | P103 | — | I1 | P44B | W7 | P39 | — | IW-5 | T6 | TX(1) |
| 56 | P110 | D0Q | — | FAL | P53 | Y11 | P3A | IW-6 | — | IW-1 |
| 57 | K5Q·Y11 | — | — | B10 | P53 | P90 | — | IW-7 | B7 | B1 |
| 58 | — | P14 | — | FAI | P51 | B2Q | P47 | IW-4 | T5 | B2 |
| 59 | — | P91 | Y11 | P44A | P51 | P17 | — | P108 | B4 | B3 |
| 60 | P85 | P33 | — | K5Q | — | P47 | — | OW-11 | B6 | — |
| 61 | P3C | — | — | B | P52 | P88 | — | OW-4 | T7 | — |
| 62 | P2 | — | — | — | P28 | P511 | P121C | OW-5 | B5 | — |
| 63 | FC | — | P91 | FY | P115 | M0Q | — | IW-3 | J0 | TS-3 |
| 64 | FB | B14 | — | FV | P52 | P89 | P85 | OW-3 | T4 | — |
| 65 | P0 | — | P15 | W0 | P50 | — | — | IW-0 | S5 | TS-2 |
| 66 | P4 | B13 | Y3 | P114 | P50 | L3Q | — | IW-2 | J1 | — |
| 67 | D1-7 | — | FAD | P133 | K3Q | — | — | D1-3 | MFE | TS-0 |
| 68 | P44A | B12 | FX | P134 | K2Q | P3 | P120D | 1W-1 | S4 | — |
| 69 | P44B | — | FW | C | K0Q | P11 | — | D1-2 | XL4 | TS-1 |
| 70 | M1Q | B11 | FAE | — | K3Q | — | P120C | D1-1 | XL2 | — |
| 71 | M0Q | — | — | D1Q | Y6 | FY | — | D0-1 | — | C14Q |
| 72 | M2Q | B2Q | Y11 | P511 | P7 | P85 | P121B | D1-0 | YL1 | OW-8 |
| 73 | M3Q | — | Y11 | D2Q | FA | — | — | D0-2 | — | — |
| 74 | FT | B10 | W0 | D3Q | P25 | — | P120B | D0-0 | XL1 | — |
| 75 | M4Q | — | P14 | D4Q | FC | LZQ | — | C14Q | XL5 | — |
| 76 | M5Q | — | B11 | D5Q | P26 | — | P121D | D0-3 | YL2 | — |
| 77 | GRD | GRD | GRD | GRD | GRD | GRD | GRD | GRD | GRD | GRD |
| 78 | — | — | P101 | D6Q | P26 | — | — | C15Q | YL3 | — |
| 79 | GRD | GRD | GRD | GRD | GRD | GRD | GRD | GRD | GRD | GRD |
| 80 | — | — | — | D7Q | — | — | — | A0Q | — | — |

TABLE IV-continued

| | Logic Card | | | | | | | | |
|---|---|---|---|---|---|---|---|---|---|
| A | B | C | D | K | W | SPM | IFA-1 | IFA-2 | IFA-3 |
| | | | | Reference FIG. | | | | | |
| Pin 6 | 7 | 8 | 9 | 10 | 11 | 12 | 13 | 14 | 15 |
| 90 — | — | — | P136 | — | — | — | — | — | — |
| 91 — | — | — | P135 | — | — | — | — | — | — |
| 92 — | — | — | P116 | — | — | — | — | — | — |
| 93 — | — | — | FAD | — | — | — | — | — | — |

TABLE V

| Micro Operation | Word Time | Bit Times |
|---|---|---|
| FA | 0 | 16 |
| FB | 0 | 16 |
| FC | 0 | 16 |
| FD | 1 | 12 |
| FE | 2 | 8 |
| FF | 3 | 1 |
| FG | 4 | 12 |
| FH | 5 | 8 |
| FI | 6 | 8 |
| FJ | 7 | 12 |
| FK | 1 | 12 |
| FL | 1 | 1 |
| FM | 2 | 8 |
| FN | 3 | 8 |
| FO | 4 | 12 |
| FP | 5 | 8 |
| FQ | 6 | 8 |
| FR | 7 | 12 |
| FS | 7 | 12 |
| FT | 1 | 16 |
| FU | 1 | 16 |
| FV | 1 | 16 |
| FW | 1 | 16 |
| FX | 1 | 16 |
| FY | 1 | 16 |
| FZ | 2 | 8 |
| FAA | 2 | 1 |
| FAB | 1 | 16 |
| FAC | 1 | 16 |
| FAD | 1 | 16 |
| FAE | 1 | 1-16 |
| FAF | 1 | 1-16 |
| FAG | 1 | 12 |
| FAH | 1 | 12 |
| FAI | 1 | 12 |
| FAJ | 3 | 16 |
| FAK | 3 | 16 |
| FAL | 4 | 16 |
| FAM | 5 | 8 |
| FAN | 6 | 8 |
| FAO | 7 | 12 |
| FAP | 1 | 16 |
| FAQ | 1 | 16 |

Although there has been described above a specific arrangement of a numerical control system in accordance with the invention for the purpose of illustrating the manner in which the invention may be used to advantage, it will be appreciated that the invention is not limited thereto. Accordingly, any and all modifications, variations or equivalent arrangements which may occur to those skilled in the art should be considered to be within the scope of the invention.

What is claimed is:

1. A data processor architecture comprising:
   an integrated circuit refreshable memory for storing computer operands in response to a memory refresh signal;
   an integrated circuit read only memory for storing computer instructions; and
   execution means for executing the computer instructions stored in said read only memory, said execution means including processing means for processing the computer operands stored in said refreshable memory in response to the execution of at least one of the computer instructions stored in said read only memory and refresh means for generating the memory refresh signal in response to the execution of at least one of the computer instructions stored in said read only memory.

2. A data processor architecture comprising:
   an integrated circuit refreshable memory for storing computer operands in response to a memory refresh signal;
   an integrated circuit read only memory for storing computer instructions and for storing computer operands; and
   execution means for executing the computer instructions stored in said read only memory, said execution means including
   (a) first processing means for processing operands stored in said read only memory in response to the execution of a first type of instruction stored in said read only memory,
   (b) second processing means for processing operands stored in said refreshable memory in response to the execution of a second type of instruction stored in said read only memory, and
   (c) refresh means for generating the memory refresh signal in response to the execution of at least one of the computer instructions stored in said read only memory.

3. A data processor architecture comprising:
   an integrated circuit refreshable memory for storing computer operands in response to a memory refresh signal;
   an integrated circuit read only memory for storing computer instructions and for storing computer operands; and
   execution means for executing the computer instructions stored in said read only memory, said execution means including
   (a) first processing means for processing the computer operands stored in said refreshable memory in response to the execution of at least one of the computer instructions stored in said read only memory,
   (b) second processing means for processing the computer operands stored in said read only memory in response to the execution of at least one of the computer instructions stored in said read only memory, and
   (c) refresh means for generating the memory refresh signal in response to the execution of at least one of the computer instructions stored in said read only memory.

4. A data processor architecture comprising:
   an integrated circuit refreshable memory for storing computer operands in response to a memory refresh signal;

an integrated circuit read only memory for storing computer instructions and for storing computer operands; and execution means for executing the computer instructions stored in said read only memory, said execution means including (a) first processing means for performing an arithmetic operation with an operand stored in said read only memory in response to the execution of a first type of arithmetic instruction stored in said read only memory, (b) second processing means for performing an arithmetic operation with an operand stored in said refreshable memory in response to the execution of a second type of arithmetic instruction stored in said read only memory, and (c) refresh means for generating the memory refresh signal in response to the execution of at least one of the computer instructions stored in said read only memory.

5. A data processor architecture comprising:

an integrated circuit refreshable memory for storing computer operands in response to a memory refresh signal;

an integrated circuit read only memory for storing computer instructions and for storing computer operands; and execution means for executing the computer instructions stored in said read only memory, said execution means including (a) first processing means for transferring to an instruction stored in said read only memory addressed by an instruction address operand stored in said read only memory in response to the execution of a first type of transfer instruction stored in said read only memory, (b) second processing means for transferring to an instruction stored in said read only memory addressed by an instruction address operand stored in said refreshable memory in response to the execution of a second type of transfer instruction stored in said read only memory, and (c) refresh means for generating the memory refresh signal in response to the execution of at least one of the computer instructions stored in said read only memory.

6. The architecture as set forth in claim 1 above, wherein said read only memory includes means for storing computer operands and wherein said processing means includes means for performing a logical operation with an operand stored in said read only memory in response to the execution of a first type of logical instruction stored in said read only memory and means for performing a logical operation with an operand stored in said refreshable memory in response to the execution of a second type of logical instruction stored in said read only memory.

7. A data processor architecture comprising:

an integrated circuit refreshable memory for storing computer operands in response to a memory refresh signal;

an integrated circuit read only memory for storing computer instructions and for storing computer operands; and execution means for executing the computer instructions stored in said read only memory, said execution means including (a) first processing means for performing an index operation with an index operand stored in said read only memory in response to the execution of a first type of index instruction stored in said read only memory, (b) second processing means for performing an index operation with an index operand stored in said refreshable memory in response to the execution of a second type of index instruction stored in said read only memory, and (c) refresh means for generating the memory refresh signal in response to the execution of at least one of the computer instructions stored in said read only memory.

8. A data processor architecture comprising:

an integrated circuit refreshable memory for storing computer operands in response to a memory refresh signal;

an integrated circuit read only memory for storing computer instructions and for storing computer operands; and execution means for executing the computer instructions stored in said read only memory, said execution means including (a) first processing means for performing an arithmetic operation with a operand stored in said read only memory in response to the execution of a multiple-byte arithmetic instruction stored in said read only memory, (b) second processing means for performing an arithmetic operation with an operand stored in said refreshable memory in response to the execution of a single-byte arithmetic instruction stored in said read only memory, and (c) refresh means for generating the memory refresh signal in response to the execution of at least one of the computer instructions stored in said read only memory.

9. A data processor architecture comprising:

an integrated circuit refreshable memory for storing computer operands in response to a memory refresh signal;

an integrated circuit read only memory for storing computer instructions and computer operands; and execution means for executing the computer instructions stored in said read only memory, said execution means including (a) processing means for transferring to an instruction stored in said read only memory addressed by an instruction address operand stored in said read only memory in response to the execution of a multiple-byte transfer instruction stored in said read only memory and means for transferring to an instruction stored in said read only memory addressed by an instruction address operand stored in said refreshable memory in response to the execution of a single-byte transfer instruction stored in said read only memory and (b) refresh means for generating the memory refresh signal in response to the execution of at least one of the computer instructions stored in said read only memory.

10. The architecture as set forth in claim 1 above, wherein said read only memory includes means for storing computer operands and wherein said processing means includes means for performing a logical operation with an operand stored in said read only memory in response to the execution of a multiple-byte logical instruction stored in said read only memory and means for performing a logical operation with an operand stored in said refreshable memory in response to the execution of a single-byte logical instruction stored in said read only memory.

11. A data processor architecture comprising:
an integrated circuit refreshable memory for storing computer operands in response to a memory refresh signal;
an integrated circuit read only memory for storing computer instructions; and
execution means for executing the computer instructions stored in said read only memory, said execution means including
   (a) paging means for selecting a page of said refreshable memory in response to execution of an instruction stored in said read only memory,
   (b) processing means for processing the computer operands stored in the selected page of said refreshable memory in response to the execution of at least one of the computer instructions stored in said read only memory, and
   (c) refresh means for generating the memory refresh signal in response to the execution of at least one of the computer instructions stored in said read only memory.

12. A data processor architecture comprising:
an integrated circuit refreshable memory for storing computer operands in response to a memory refresh signal;
an integrated circuit read only memory for storing computer instructions;
means for generating a read only memory address;
means for accessing an instruction from said read only memory in response to the read only memory address for execution with an execution means;
means for generating a refreshable memory address;
means for accessing an operand from said refreshable memory in response to the refreshable memory address for processing with a processing means, wherein at least a part of the time for accessing an instruction from said read only memory is coincident with at least a part of the time for accessing an operand from said refreshable memory; and
execution means for executing the computer instruction accessed from said read only memory, said execution means including
   (a) processing means for processing the computer operand accessed from said refreshable memory in response to the execution of the computer instruction accessed from said read only memory and
   (b) refresh means for generating the memory refresh signal in response to the execution of the computer instruction accessed from said read only memory.

13. A data processor architecture comprising:
an integrated circuit refreshable memory for storing computer operands in response to a memory refresh signal;
an integrated circuit read only memory for storing computer instructions; and
execution means for executing the computer instructions stored in said read only memory, said execution means including
   (a) means for accessing an instruction from said read only memory for the execution thereof with an execution means,
   (b) means for accessing an operand from said refreshable memory for the processing thereof with a processing means,
   (c) means for overlapping the accessing of an instruction from said read only memory and the accessing of an operand from said refreshable memory,
   (d) processing means for processing the computer operands stored in said refreshable memory in response to the execution of at least one of the computer instructions stored in said read only memory, and
   (e) refresh means for generating the memory refresh signal in response to the execution of at least one of the computer instructions stored in said read only memory.

14. A data processor architecture comprising:
an integrated circuit refreshable memory for storing computer operands in response to a memory refresh signal;
an integrated circuit read only memory for storing computer instructions including eight-bit computer instructions; and
execution means for executing the computer instructions stored in said read only memory, said execution means including
   (a) processing means for storing a sixteen-bit instruction address in said refreshable memory in response to the execution of an eight bit instruction stored in said read only memory and
   (b) refresh means for generating the memory refresh signal in response to the execution of at least one of the computer instructions stored in said read only memory.

15. A data processor architecture comprising:
an integrated circuit read only memory for storing eight-bit computer instructions;
an integrated circuit refreshable memory for storing sixteen bit computer operands in response to a memory refresh signal; and
execution means for executing the computer instructions stored in said read only memory, said execution means including
   (a) processing means for processing a sixteen-bit computer operand stored in said refreshable memory in response to the execution of an eight-bit computer instruction stored in said read only memory and
   (b) refresh means for generating the memory refresh signal in response to the execution of at least one of the computer instructions stored in said read only memory.

16. The architecture as set forth in claim 1 above, wherein said read only memory includes means for storing an eight-bit instruction and means for storing a sixteen-bit operand, wherein said processing means includes means for loading a sixteen-bit operand from said read only memory into said refreshable memory in response to the execution of an eight-bit instruction stored in said read only memory.

17. An integrated circuit data processor architecture comprising:
an integrated circuit read only memory for storing processor instructions;

an integrated circuit refreshable memory for storing processed information in response to a memory refresh signal; and execution means for executing the instructions stored in said read only memory, said execution means including processing means for processing information stored in said refreshable memory in response to the execution of an instruction stored in said read only memory and synchronization means for generating the memory refresh signal in synchronization with and in response to the execution of an instruction stored in said read only memory.

18. The architecture as set forth in claim 17 above, wherein said processing means and said synchronization means are implemented on multiple integrated circuit chips.

19. An integrated circuit data processor architecture comprising:
   an integrated circuit read only memory for storing eight-bit processor instructions;
   an integrated circuit refreshable memory for storing sixteen-bit processed information in response to a memory refresh signal; and
   execution means for executing the instructions stored in said read only memory, said execution means including
   (a) processing means for processing the sixteen-bit information stored in said refreshable memory in response to the execution of the eight-bit instructions stored in said read only memory and
   (b) synchronization means for generating the memory refresh signal in synchronization with and in response to the execution of an instruction stored in said read only memory.

20. An integrated circuit data processor architecture comprising:
   an integrated circuit read only memory for storing processor instructions;
   an integrated circuit refreshable memory for storing processed information in response to a memory refresh signal;
   micro-instruction means for executing a plurality of micro-instructions in response to the execution of an instruction stored in said read only memory; and
   execution means for executing the instructions stored in said read only memory, said execution means including
   (a) processing means for processing information stored in said refreshable memory in response to the execution of an instruction stored in said read only memory and
   (b) synchronization means for generating the memory refresh signal in synchronization with and in response to the execution of an instruction responsive microinstruction.

21. An integrated circuit data processor architecture comprising:
   an integrated circuit read only memory for storing processor instructions;
   an integrated circuit refreshable memory for storing processed information in response to a memory refresh signal; and
   execution means for executing the instructions stored in said read only memory, said execution means including
   (a) micro-operation means for generating a plurality of sequential micro-operations in response to the execution of an instruction stored in said read only memory,
   (b) processing means for processing information stored in said refreshable memory in response to the execution of an instruction stored in said read only memory, and
   (c) synchronization means for generating the memory refresh signal in synchronization with and in response to the execution of an instruction responsive microoperation.

22. An integrated circuit data processor architecture comprising:
   an integrated circuit read only memory for storing processor instructions;
   an integrated circuit refreshable memory for storing processed information in response to a memory refresh signal;
   means for accessing a single byte instruction from said read only memory;
   means for executing the accessed single byte instruction to process the information stored in said refreshable memory;
   means for accessing a double byte instruction from said read only memory;
   means for executing the accessed double byte instruction to process the information stored in said refreshable memory;
   means for accessing a triple byte instruction from said read only memory;
   means for executing the accessed triple byte instruction to process the information stored in said refreshable memory; and
   synchronization means for generating the memory refresh signal in synchronization with and in response to the execution of an instruction stored in said read only memory.

23. The architecture as set forth in claim 17 above, wherein said processing means includes loading means for loading digital information stored in said read only memory into said refreshable memory, said loading means including:
   means for accessing a load instruction from said read only memory;
   means for accessing the stored digital information to be loaded from said read only memory in response to the execution of the load instruction; and
   means for storing the digital information accessed from said read only memory in said refreshable memory in response to the execution of the load instruction.

24. An integrated circuit data processor architecture comprising:
   an integrated circuit read only memory for storing processor instructions;
   an integrated circuit refreshable memory for storing processed information in response to a memory refresh signal;
   execution means for executing the instructions stored in said read only memory, said execution means including processing means for processing information stored in said refreshable memory in response to the execution of an instruction stored in said read only memory and synchronization means for generating the memory refresh signal in synchronization with and in response to the execution of an instruction stored in said read only memory;
   a refreshable display for displaying information in response to a display refresh signal; and display refresh means for generating the display refresh signal in response to the execution responsive processing of information stored in said refreshable memory.

25. A stored program data processor comprising:
a main memory for storing a data processing program having a plurality of instructions;
a dynamic integrated circuit memory for storing intermediate information in response to a refresh signal; and
execution means for executing the instructions stored in said main memory, said execution means including processing means for processing information stored in said dynamic integrated circuit memory in response to the execution of a stored instruction and refresh means for generating the refresh signal in response to the execution of a stored instruction.

26. The data processor as set forth in claim 25 above wherein said dynamic integrated circuit memory includes an integrated circuit register requiring a refresh signal to be provided at a rate at least as high as a minimum refresh rate to preserve the information stored therein; wherein the instruction execution rate is at least as high as the minimum refresh rate; and wherein the refresh signal is generated in response to the execution of a stored instruction.

27. A stored program computer comprising:
a main memory for storing computer instructions;
an alterable integrated circuit memory for storing alterable information in response to a refresh signal; and
execution means for executing the computer instructions stored in said main memory, said execution means including control means for generating a sequence of control signals in response to the execution of an instruction stored in said main memory wherein at least one of said sequence of control signals is the refresh signal and including processing means for processing the information stored in said alterable integrated circuit memory in response to at least one of the control signals.

28. The computer as set forth in claim 27 above, wherein said alterable integrated circuit memory includes a register for storing alterable information in response to the refresh signal.

29. The computer as set forth in claim 27 above, wherein said main memory is an integrated circuit read only memory for storing the instructions in read only form and wherein said computer is a monolithic computer implemented on a plurality of integrated circuit chips.

30. A stored program computer comprising:
a main memory for storing computer instructions;
an alterable integrated circuit memory for storing alterable information in response to a refresh signal, wherein said alterable memory includes:
(a) address means for storing a memory address,
(b) an integrated circuit random access memory for storing the alterable information in response to a refresh signal, and
(c) accessing means for accessing stored alterable information from said integrated circuit random access memory in response to the memory address for processing with a processing means; and
execution means for executing the computer instructions stored in said main memory, said execution means including
(a) control means for generating a sequence of control signals in response to the execution of an instruction stored in said main memory wherein at least one of said sequence of control signals is the refresh signal and
(b) processing means for processing the alterable information accessed from said integrated circuit random access memory in response to at least one of the control signals.

31. A data processor comprising:
a main memory for storing a plurality of instructions;
a refreshable integrated circuit memory for storing digital information in response to a refresh signal;
execution means for executing stored instructions, said execution means including sequential means for generating a sequence of signals in response to execution of a stored instruction; and
refresh means for generating the refresh signal in response to at least one of the sequence of signals from said sequential means.

32. The data processor as set forth in claim 31 above, wherein said refreshable integrated circuit memory includes a MOS-FET integrated circuit shift register memory.

33. The data processor as set forth in claim 31 above, wherein said data processor is a monolithic data processor, wherein said monolithic data processor includes a plurality of integrated circuit chips, and wherein said main memory includes an integrated circuit read only memory for storing the instructions.

* * * * *